US005939235A

United States Patent [19]

Kondo et al.

[11] Patent Number: 5,939,235

[45] **Date of Patent: *Aug. 17, 1999**

[54] POSITIVE-WORKING LIGHT-SENSITIVE COMPOSITION

[75] Inventors: Syunichi Kondo; Akira Umehara; Yoshimasa Aotani, all of Shizuoka-ken; Tsuguo Yamaoka, Funabashi, all of Japan

[73] Assignee: Fuji Photo Film Co., Ltd., Minami-ashigara, Japan

[ * ] Notice: This patent is subject to a terminal disclaimer.

[21] Appl. No.: 08/968,210

[22] Filed: Nov. 12, 1997

Related U.S. Application Data

[63] Continuation of application No. 08/545,370, Oct. 19, 1995, which is a continuation of application No. 08/176,257, Jan. 3, 1994.

[30] Foreign Application Priority Data

Feb. 5, 1993 [JP] Japan .................................... 5-018793

[51] Int. Cl.$^6$ ...................................................... G03C 1/73

[52] U.S. Cl. .................................... 430/270.1; 430/287.1; 430/288.1

[58] Field of Search ............................. 430/270.1, 287.1, 430/288.1

[56] References Cited

U.S. PATENT DOCUMENTS

| | | | |
|---|---|---|---|
| 4,247,611 | 1/1981 | Sander et al. | 430/270 |
| 4,248,957 | 2/1981 | Sander et al. | 430/270 |
| 5,015,554 | 5/1991 | Ruckert et al. | 430/270 |
| 5,364,738 | 11/1994 | Kondo et al. | 430/270.1 |

FOREIGN PATENT DOCUMENTS

| | | |
|---|---|---|
| A0006627 | 1/1980 | European Pat. Off. . |
| A0536690 | 4/1993 | European Pat. Off. . |
| 4124426 | 1/1992 | Germany . |

*Primary Examiner*—M. Nuzzolillo
*Assistant Examiner*—Laura Weiner
*Attorney, Agent, or Firm*—Burns, Doane, Swecker & Mathis, LLP

[57] ABSTRACT

A positive-working light-sensitive composition comprising (a) a compound having at least two enol ether groups, represented by the following general formula (I); (b) a linear polymer having acidic groups; and (c) a compound capable of generating an acid through irradiation with actinic light rays or radiant rays, the component (a) and the component (b) being thermally crosslinked:

$$(R^2)(R^1)C{=}C(R^3){-}O{-} \quad (I)$$

wherein $R^1$, $R^2$ and $R^3$ may be the same or different and each represents a hydrogen atom, an alkyl group or an aryl group, provided that each two of $R^1$, $R^2$ and $R^3$ may be linked together to form a saturated or olefinically unsaturated ring. The positive-working light-sensitive composition has high light-sensitivity and permits the use of light rays extending over a wide range of wavelengths. Therefore, the positive-working light-sensitive composition of the present invention can provide clear positive images and has a wide development latitude.

7 Claims, No Drawings

POSITIVE-WORKING LIGHT-SENSITIVE COMPOSITION

This application is a continuation of application Ser. No. 08/545,370, filed Oct. 19, 1995, which is a continuation of application Ser. No. 08/176,257, filed Jan. 3, 1994.

BACKGROUND OF THE INVENTION

The present invention relates to a positive-working light-sensitive composition which permits the formation of a lithographic printing plate, a multicolor proof sheet and a figure for use in an overhead projector as well as fine resist patterns when producing integrated circuits of semiconductors.

Ortho-quinonediadide compounds have conventionally been known as so-called positive-working light-sensitive substances for use in making, for instance, lithographic printing plates and are solubilized through irradiation with actinic light rays and in fact, they have widely been used for the preparation of lithographic printing plates. Such o-quinonediazide compounds are disclosed in various publications such as U.S. Pat. Nos. 2,766,118; 2,767,092; 2,772,972; 2,859,112; 2,907,665; 3,046,110; 3,046,111; 3,046,115; 3,046,118; 3,046,119; 3,046,120; 3,046,121; 3,046,122; 3,046,123; 3,061,430; 3,102,809; 3,106,465; 3,635,709; and 3,647,443.

These o-quinonediazide compounds can be decomposed through irradiation with actinic light rays to give 5-membered cyclic carboxylic acids and thus are made alkali-soluble. The positive-working light-sensitive composition makes use of the foregoing properties of these compounds, but the sensitivity thereof is still insufficient. This is because it is difficult to photochemically sensitize these o-quinonediazide compounds and correspondingly, the quantum yield thereof does not essentially exceed 1.

Moreover, lithographic printing plates or the like are in general prepared by imagewise exposing, to light, presensitized plates comprising light-sensitive layers containing these compounds using a printer to form desired patterns and then removing the exposed areas thereof with an alkali developer or a solvent. However, the presensitized plate suffers from various problems. For instance, the sensitivity of the presensitized plate is changed (narrow development latitude) since the development thereof is greatly affected by various factors such as temperatures and concentrations of developers and solvents used and developing time.

Moreover, the light-sensitive materials comprising o-quinonediazide compounds are sensitive only to light rays of specific wavelengths, light sources usable for the development thereof are accordingly limited to specific ones and this makes it difficult to impart stability to white light to the light-sensitive materials. In addition, the compounds have high absorbances in the Deep UV region and therefore, they cannot favorably be applied to, for instance, photoresists which require the improvement in the resolving power through the use of light rays of short wavelengths.

Many attempts have been done for the elimination of these disadvantages, for instance, methods disclosed in various publications such as Japanese Patent Publication for Opposition Purpose (hereunder referred to as "J.P. KOKOKU") No. Sho 48-12242, Japanese Un-examined Patent Publication (hereunder referred to as "J.P. KOKAI") No. Sho 52-40125 and U.S. Pat. No. 4,307,173, but there has still remained a room for improvement.

Recently, some attempts have been proposed for the development of novel positive-working light-sensitive materials which can be used in place of the o-quinonediazide compounds. For instance, J.P. KOKOKU No. Sho 56-2696 discloses polymeric compounds having o-carbinol ester groups. However, these novel positive-working light-sensitive materials were still insufficient in sensitivity.

On the other hand, methods for forming patterns while making use of photoresists have generally been adopted in the production of electronic parts such as semiconductor elements, magnetic bubble memories and integrated circuits. In addition, a high packaging density and a high level of integration have increasingly been required for the production of electronic parts such as semiconductor elements and correspondingly, there has been required for the formation of patterns of very fine line widths and line spaces and the dry etching method has been adopted for etching substrates. For this reason, there has been desired for the development of photoresists exhibiting high resolving power and high resistance to dry etching and accordingly, negative-working photoresists currently used exclusively have been superseded by positive-working photoresists recently. In particular, there have widely been used currently alkali-developable positive-working photoresists mainly comprising alkali-soluble novolak resins such as those disclosed in, for instance, J. C. Striata, Kodak Microelectronics Seminar Proceedings, p. 116 (1976) because of their high sensitivity, high resolving power and excellent resistance to dry etching.

However, there has intensively been required for the formation of finer patterns in order to further increase the packaging density and the level of integration of electronic machinery and equipments in proportion to the recent increase in the diversity and required sensitivity thereof. To meet these demands, there have been proposed light-sensitive materials comprising the combinations of the conventional o-quinonediazide light-sensitive substances with silicone polymers such as polysiloxanes or polysil methylenes which are made alkali-soluble such as light-sensitive compositions disclosed in, for instance, J.P. KOKAI Nos. Sho 61-256347, Sho 61-144639, Sho 62-159141, sho 62-191849, Sho 62-220949, Sho 62-229136, Sho 63-90534 and Sho 63-91654; and light-sensitive compositions comprising combinations of polysiloxane/carbonate block copolymers with effective amounts of onium salts such as those disclosed in, for instance, J.P. KOKAI No. Sho 62-136638. However, these silicone polymers should be converted into alkali-soluble ones and this makes the preparation thereof very difficult. Moreover, they are insufficient in stability with time.

An example of the positive-working light-sensitive material which has recently been proposed and which is usable instead of the conventional quinonediazide compound includes a composition comprising a compound capable of photolytically generating an acid, a compound whose solubility in an alkaline water can be changed through, for instance, hydrolysis with an acid and an optional binder resin. There may be mentioned, for instance, a method for forming a positive image by decomposing a specific low molecular weight or high molecular weight acetal and O,N-acetal comprising an aromatic compound as a hydroxyl or amine component (U.S. Pat. No. 3,779,778), and an ortho ester and an amidoacetal (DEOS No. 2,610,842) with an acid generated through exposure to light. Moreover, methods for forming positive images in the same manner are disclosed in, for instance, J.P. KOKAI Nos. Sho 64-33546, Sho 48-89003, Sho 51-120714, Sho 53-133429, Sho 55-126236, Sho 53-133428, Sho 55-12995, Sho 57-31674, Sho 57-31675, Sho 57-37347, Sho 62-215947, Hei 1-106040 and Hei 1-106041.

However, all of these conventional compositions have low sensitivity or a low solubility difference between exposed and non-exposed areas or provide only insufficient shapes of patterns of the resulting positive images and therefore, they have not yet been practically used.

Further J.P. KOKAI No. Sho 62-45971 discloses that a positive image can be formed in the same manner described above through the use of an enol ether group-containing compound as a compound capable of being decomposed with an acid. In addition, J.P. KOKAI No. Hei 4-215661 discloses that a positive image can be formed in the same manner discussed above by reacting a monofunctional vinyl ether compound with carboxyl groups present on a resin to form a polymer having an acetal structure. However, these methods provide clear positive images only under limited image-forming conditions because of low sensitivity and a low solubility difference between exposed and non-exposed areas.

SUMMARY OF THE INVENTION

Accordingly, an object of the present invention is to provide a novel positive-working light-sensitive composition which permits the solution of the foregoing problems associated with the conventional light-sensitive compositions and more specifically to provide a novel positive-working light-sensitive composition which has high sensitivity and is sensitive to light rays extending over a wide range of wavelengths.

Another object of the present invention is to provide a novel positive-working light-sensitive composition which has a high solubility difference between exposed and non-exposed areas thereof and a high development latitude.

The inventors of this invention have searched for a novel positive-working light-sensitive composition usable in place of those comprising o-quinonediazide compounds in order to achieve the foregoing objects, have found out that when a combination of a compound having at least two enol ether groups such as vinyl ether groups and, for instance, an acrylic resin carrying carboxyl groups is diluted with a solvent to give a solution, then applied onto a substrate and dried, the foregoing components are made insoluble in, for instance, an alkaline aqueous solution and solvents through effective thermal crosslinking by the action of the heat applied thereto during the drying process and that the portion thermally crosslinked is made soluble through efficient hydrolysis in the presence of an acid and thus have completed the present invention.

The present invention thus relates to a positive-working light-sensitive composition which comprises (a) a compound having at least two enol ether groups, represented by the following general formula (I); (b) a linear polymer having acidic groups; and (c) a compound capable of generating an acid through irradiation with actinic light rays or radiant rays and wherein the component (a) and the component (b) are thermally crosslinked:

$$(R^2)(R^1)C{=}C(R^3){-}O{-} \qquad \text{(I)}$$

wherein $R^1$, $R^2$ and $R^3$ may be the same or different and each represents a hydrogen atom, an alkyl group or an aryl group, provided that each two of $R^1$, $R^2$ and $R^3$ may be linked together to form a saturated or olefinically unsaturated ring.

The present invention will hereunder be explained in more detail.

The positive-working light-sensitive composition of the present invention comprises the foregoing three components (a), (b) and (c) and is first characterized by the fact that the enol ether group-containing compound (a) and the linear polymer (b) form a crosslinked structure through a thermal crosslinking reaction.

First of all, the enol ether group-containing compound (a) as an essential component of the composition of the present invention will be detailed below.

If the substituents $R^1$, $R^2$ and $R^3$ in the enol ether group of Formula (I) each represents an aryl group, the aryl group may be one generally having 4 to 20 carbon atoms and may be substituted with an alkyl, alkoxy, aryloxy, acyl, acyloxy, alkylmercapto, aminoacyl, carboalkoxy, nitro, sulfonyl or cyano group or a halogen atom.

If the substituents $R^1$, $R^2$ and $R^3$ each represents an alkyl group, it may be a saturated or unsaturated, linear, branched or alicyclic alkyl group preferably having 1 to 20 carbon atoms and may be substituted with a halogen atom, a cyano, ester, oxy, alkoxy, aryloxy or aryl group.

Moreover, if any two of these substituents $R^1$, $R^2$ and $R^3$ are bonded together to form a cycloalkyl or cycloalkenyl group, the group may be generally a 3 to 8-membered, preferably 5 or 6-membered cyclic group.

In the present invention, preferred enol ether groups represented by Formula (I) include those in which one of the substituents $R^1$, $R^2$ and $R^3$ represents a methyl or ethyl group and the other groups are hydrogen atoms; and more preferably the enol ether group of Formula (I) in which all of the substituents $R^1$, $R^2$ and $R^3$ are hydrogen atoms, i.e., a vinyl ether group.

Various compounds having at least two enol ether groups may be used in the present invention, but preferred are those having boiling points, as determined at atmospheric pressure, of not less than 60° C. Examples of compounds preferably used as the component (a) are vinyl ether compounds represented by the following general formula (II) or (III):

$$A{-}[O{-}(R^4{-}O)_n{-}CH{=}CH_2]_m \qquad \text{(II)}$$

$$A{-}[B{-}R^4{-}O{-}CH{=}CH_2]_m \qquad \text{(III)}$$

wherein A represents an alkyl, aryl or heterocyclic group having a valency of m; B represents a group —CO—O—, —NHCOO— or —NHCONH—; $R^4$ represents a linear or branched alkylene group having 1 to 10 carbon atoms; n is 0 or an integer ranging from 1 to 10; and m is an integer ranging from 2 to 6.

The compounds represented by Formula (II) can be synthesized by, for instance, the method disclosed in Stephen. C. Lapin, Polymers Paint Colour Journal, 179 (4237), 321 (1988), i.e., through a reaction of a polyhydric alcohol or a polyhydric phenol with acetylene, or a reaction of a polyhydric alcohol or a polyhydric phenol with a halogenated alkyl vinyl ether.

Specific examples thereof are ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, triethylene glycol diethylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,2-di-(vinyl ether methoxy)benzene, 1,2-di-(vinyl ether ethoxy)benzene and compounds represented by the following formulas (II-1) to (II-41), but the compounds of Formula (II) usable in the present invention are not restricted to these specific examples:

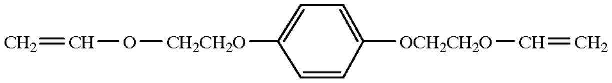
(II-1)
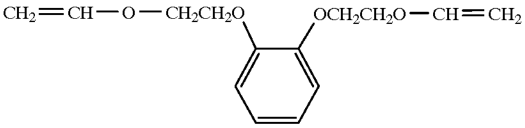
(II-2)
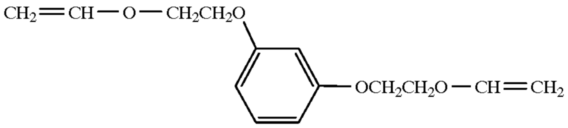
(II-3)
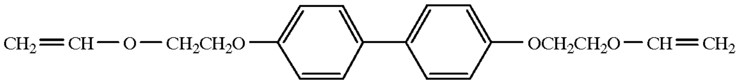
(II-4)
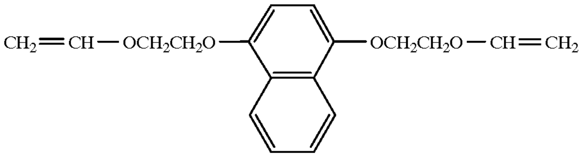
(II-5)
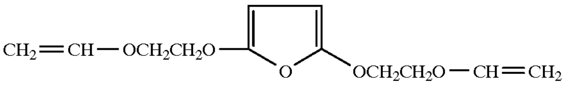
(II-6)
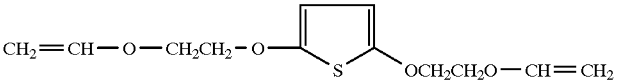
(II-7)
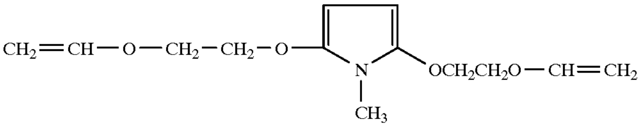
(II-8)
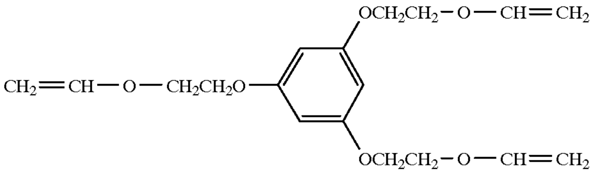
(II-9)
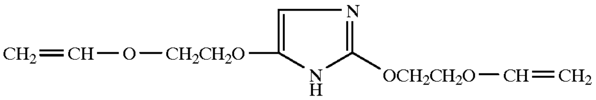
(II-10)
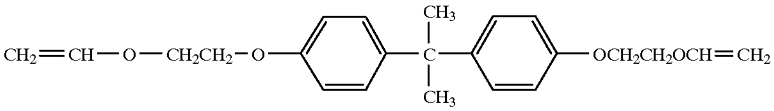
(II-11)
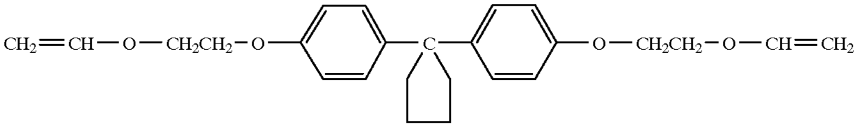
(II-12)

-continued
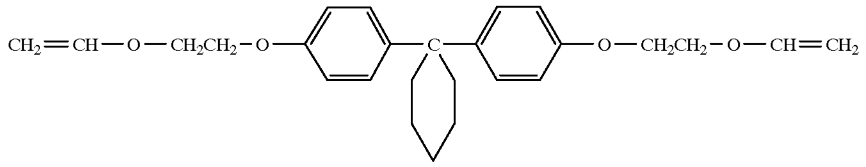
(II-13)
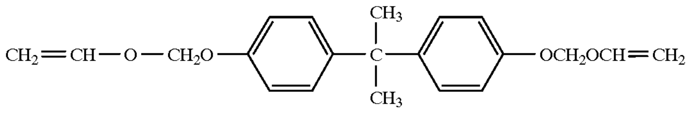
(II-14)
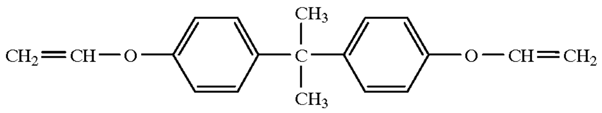
(II-15)
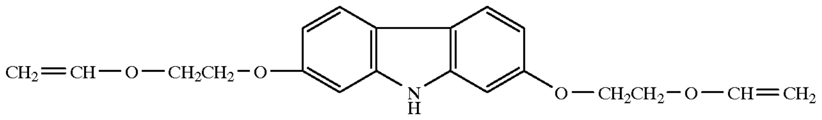
(II-16)
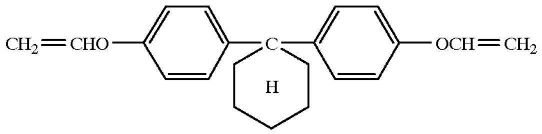
(II-17)
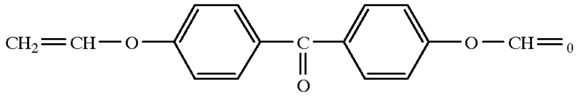
(II-18)
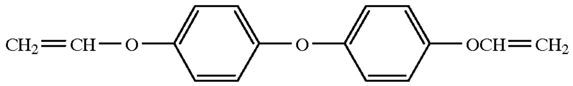
(II-19)
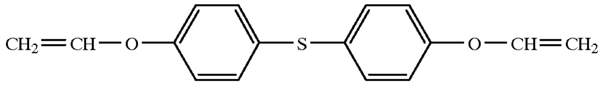
(II-20)
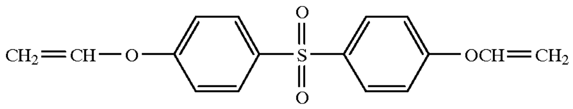
(II-21)
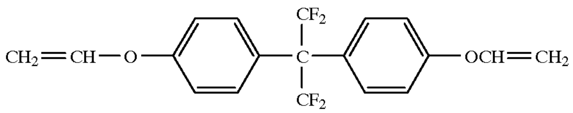
(II-22)
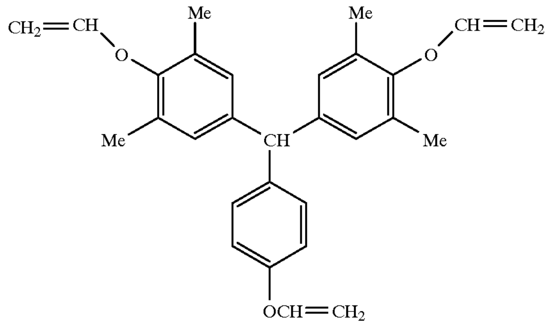
(II-23)

-continued
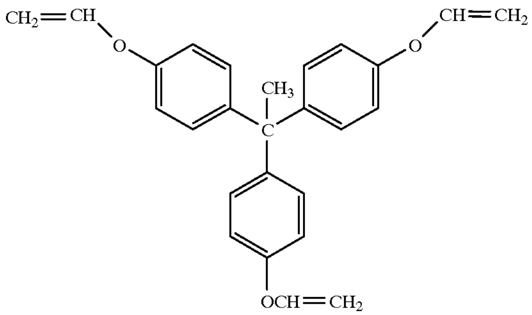
(II-24)
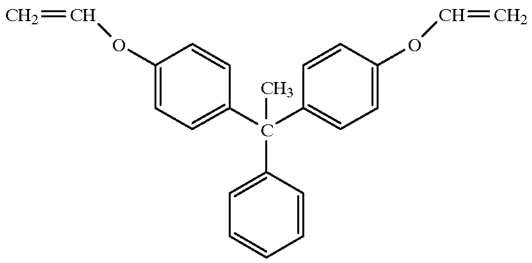
(II-25)
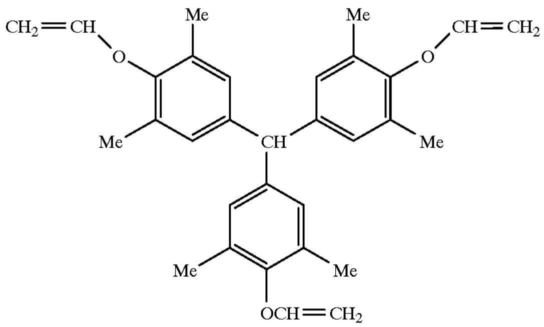
(II-26)
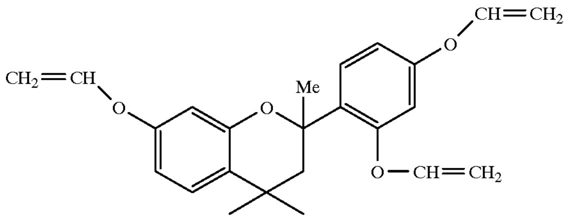
(II-27)
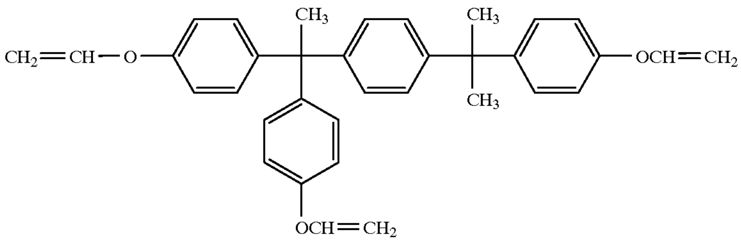
(II-28)

-continued
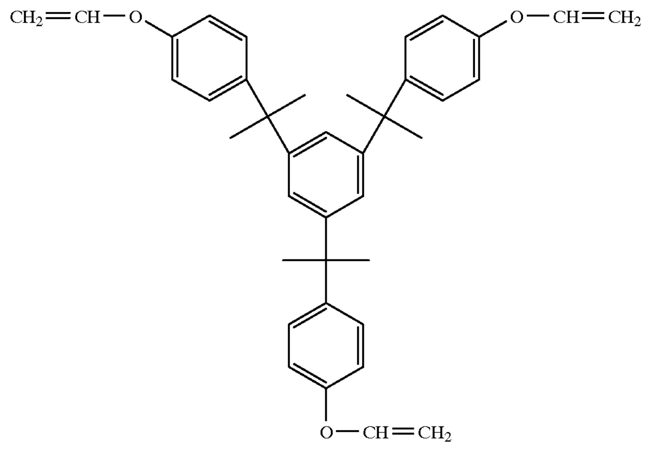
(II-29)
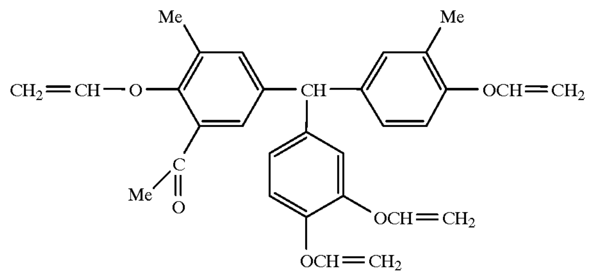
(II-30)
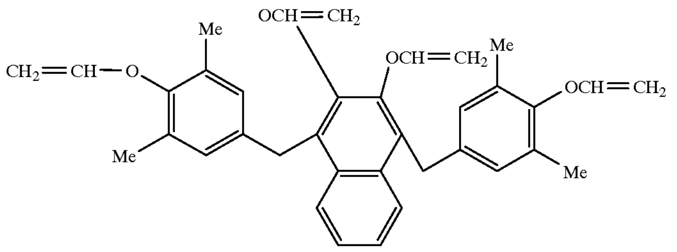
(II-31)
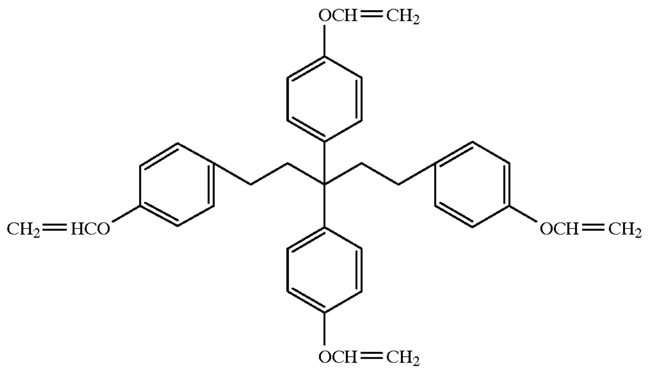
(II-32)

-continued
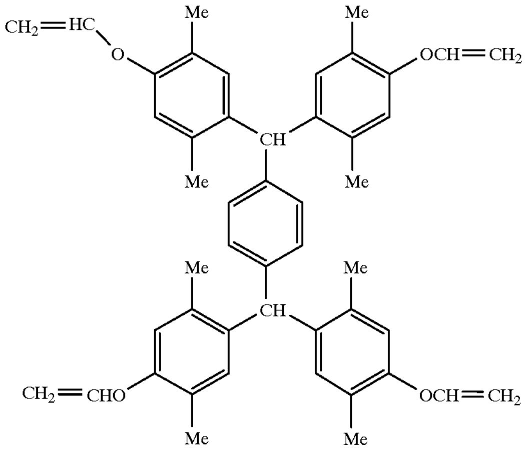
(II-33)
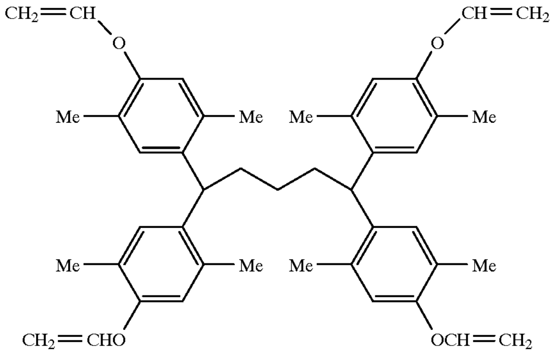
(II-34)
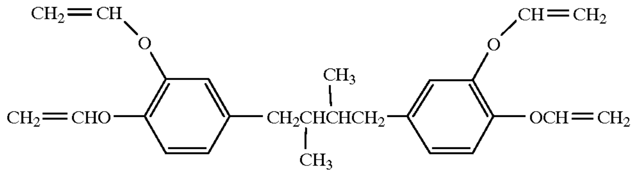
(II-35)
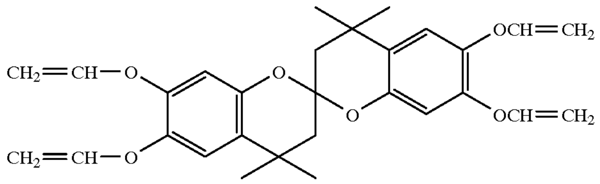
(II-36)
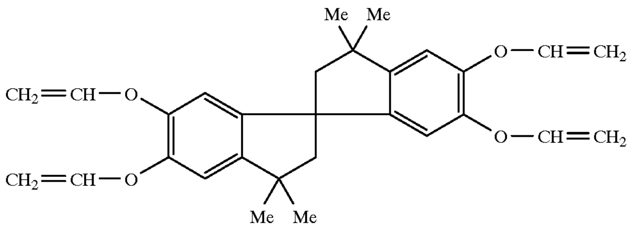
(II-37)
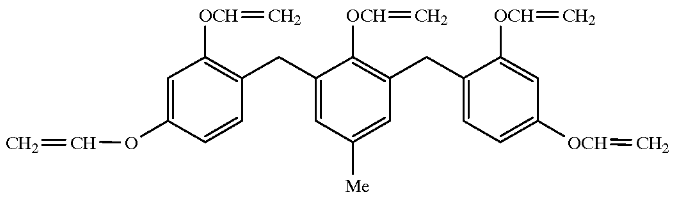
(II-38)

-continued

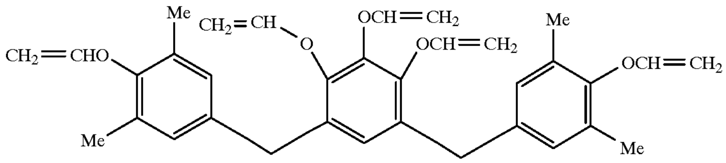

(II-39)

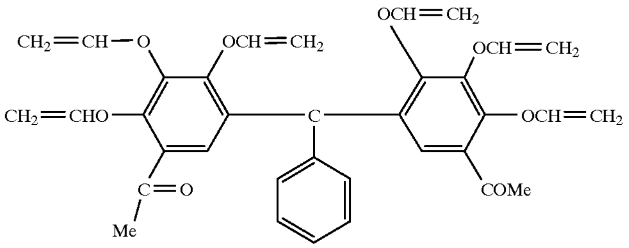

(II-40)

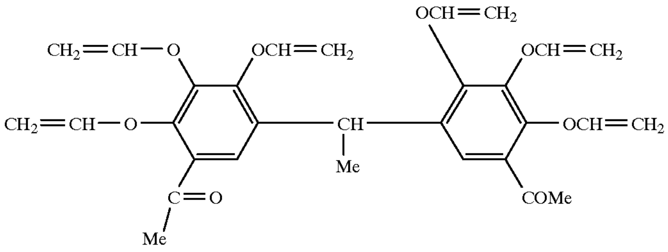

(II-41)

On the other hand, the compounds represented by Formula (III) (wherein B is a group —CO—O—) can be prepared by reacting polyvalent carboxylic acids with halogenated alkyl vinyl ethers.

Specific examples of the compounds represented by Formula (III) include terephthaloyl diethylene vinyl ether, phthaloyl diethylene vinyl ether, isophthaloyl diethylene vinyl ether, phthaloyl dipropylene vinyl ether, terephthaloyl dipropylene vinyl ether, isophthaloyl dipropylene vinyl ether, maleoyl diethylene vinyl ether, fumaroyl diethylene vinyl ether and itaconoyl diethylene vinyl ether, but the compounds of Formula (III) usable in the present invention are not restricted to these specific examples.

Moreover, the enol ether group (in particular, vinyl ether group)-containing compounds suitably used in the composition of the present invention further include those represented by, for instance, the following general formula (IV), (V) or (VI) which are synthesized by reacting active hydrogen atom-containing vinyl ether compounds with isocyanate group-containing compounds:

$$CH_2{=}CH{-}O{-}R^5{-}OH \quad (IV)$$

$$CH_2{=}CH{-}O{-}R^5{-}COOH \quad (V)$$

$$CH_2{=}CH{-}O{-}R^5{-}NH_2 \quad (VI)$$

wherein $R^5$ represents a linear or branched alkylene group having 1 to 10 carbon atoms. The isocyanate group-containing compounds usable herein may be those disclosed in, for instance, Handbook of Crosslinking Agents (published by Taisei Publishing Company Jap., in 1981).

Specific examples thereof include polyisocyanate type ones such as triphenylmethane triisocyanate, diphenylmethane diisocyanate, tolylene diisocyanate, dimer of 2,4-tolylene diisocyanate, naphthalene-1,5-diisocyanate, o-tolylene diisocyanate, polymethylene polyphenyl isocyanate and hexamethylene diisocyanate; and polyisocyanate adduct type ones such as adduct of tolylene diisocyanate with trimethylolpropane, hexamethylene diisocyanate with water and xylene diisocyanate with trimethylolpropane.

Various compounds carrying terminal vinyl groups can be prepared by reacting the isocyanate group-containing compounds with the active hydrogen atom-containing vinyl ether compounds discussed above. Examples of such compounds will be listed below, but the scope of the present invention is by no means limited to these specific ones:

(VII-1)

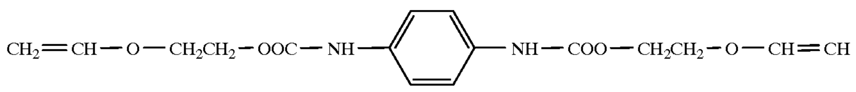

-continued
(VII-2)
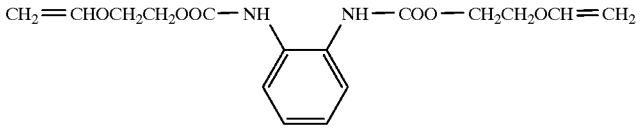
(VII-3)
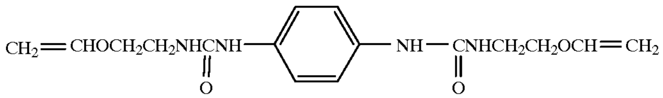
(VII-4)
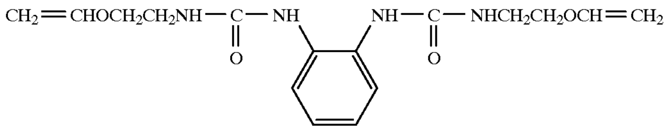
(VII-5)
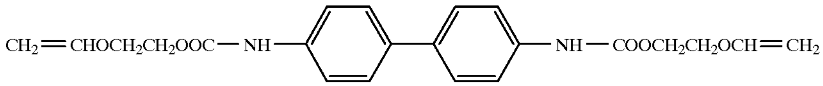
(VII-6)
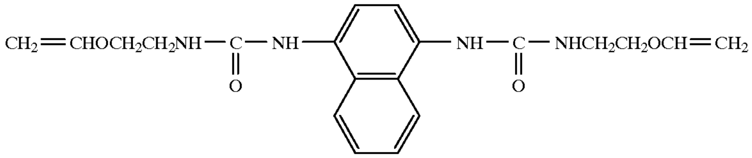
(VII-7)
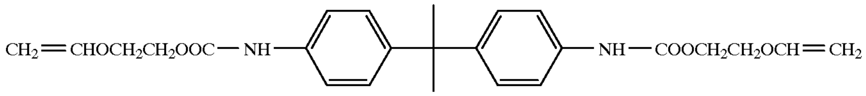
(VII-8)
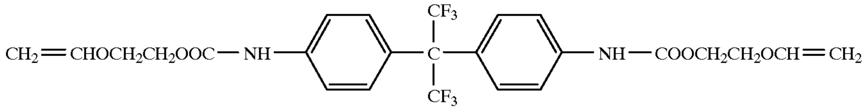
(VII-9)
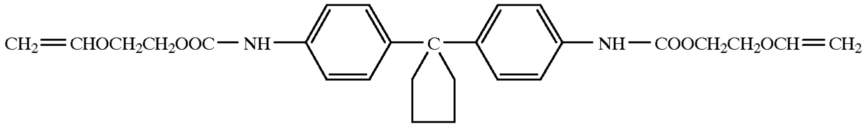
(VII-10)
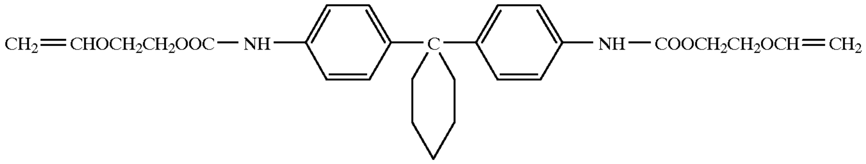
(VII-11)
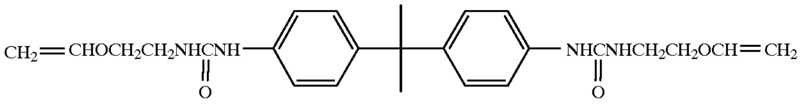
(VII-12)
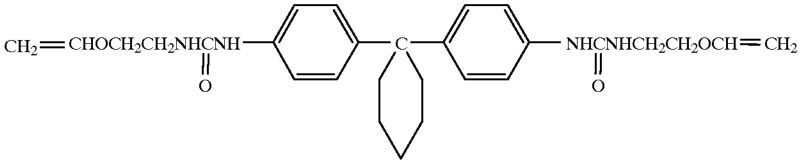

-continued (VII-13)

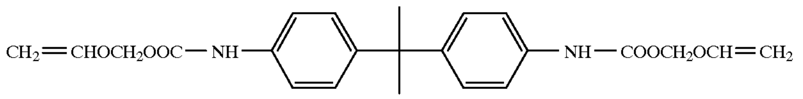

(VII-14)

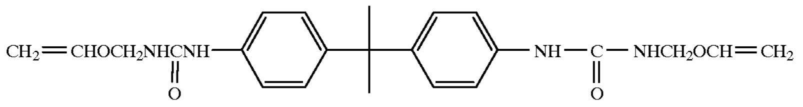

(VII-15)

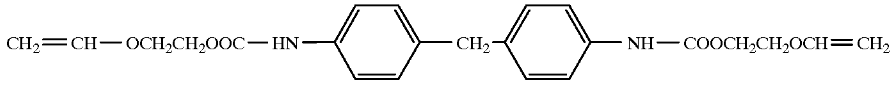

The compounds having at least two enol ether groups (in particular, vinyl ether groups) discussed above may be used alone or in combination.

The enol ether group (in particular, vinyl ether group)-containing compound may be added to the light-sensitive composition of the present invention in an amount generally ranging from 1 to 80% by weight and preferably 5 to 50% by weight on the basis of the total solid content of the composition.

The linear polymers (b) having acidic groups used in the present invention may be any polymeric compounds so far as they can be thermally crosslinked with the compounds (a) having at least two enol ether groups discussed above and the resulting crosslinked product is capable of being efficiently decomposed by the action of an acid in the crosslinked portions of the product.

The foregoing linear polymers having acidic groups in the molecule may in general be synthesized by any known method for preparing such linear polymers. For instance, the polymer can be prepared by copolymerizing a vinyl monomer having an acidic group which is preferably a carboxyl group, a sulfonate group, a phosphate group and/or a sulfonamido group with another vinyl monomer copolymerizable therewith.

Examples of the acidic group-containing vinyl monomers are acrylic acid, methacrylic acid, maleic acid, itaconic acid, crotonic acid, isocrotonic acid, p-vinylbenzoic acid, p-vinylbenzenesulfonic acid, p-vinylcinnamic acid, maleic acid monomethyl ether and maleic acid monoethyl ether, but the present invention is not limited to these specific examples.

The other vinyl monomers copolymerizable with the foregoing vinyl monomers having acidic groups include, for instance, acrylonitrile, acrylamide, methacrylamide, methyl acrylate, ethyl acrylate, propyl acrylate, butyl acrylate, methyl methacrylate, ethyl methacrylate, propyl methacrylate, butyl methacrylate, benzyl acrylate, benzyl methacrylate, vinyl benzoate, vinyl chloride, vinylidene chloride, styrene, vinyl acetate, N-(4-sulfamoylphenyl) methacrylamide, N-phenylphosphonyl methacrylamide, butadiene, chloroprene, isoprene, 2-hydroxyethylstyrene, 2-hydroxyethyl acrylate, 2-hydroxyethyl methacrylate, p-2-hydroxyethylstyrene and p-hydroxystyrene, but the monomers usable in the present invention are not limited to these specific monomers.

The foregoing copolymers may be prepared by copolymerizing any combination and any number of the foregoing acidic group-containing vinyl monomers and other copolymerizable monomers, but the weight ratio of the acidic group-containing vinyl monomer to the copolymerizable monomer suitably ranges from 2:98 to 80:20 and preferably 5:95 to 70:30. Moreover, the acidic group-containing linear polymer (b) may be prepared by, for instance, reacting a dihydroxy compound having an acidic group with a diisocyanate compound, or co-condensing a dihydroxy compound having an acidic group with a dicarboxylic acid compound.

For instance, a carboxyl group-containing linear polyurethane resin can be prepared by reacting an acidic group-containing dihydroxy compound such as 3,5-dihydroxybenzoic acid, 2,2-bis(hydroxymethyl)propionic acid, 2,2-bis(2-hydroxyethyl) propionic acid, 2,2-bis(3-hydroxypropyl)propionic acid, bis(hydroxymethyl)acetic acid, bis(4-hydroxyphenyl)acetic acid, 4,4-bis(4-hydroxyphenyl)pentanoic acid or tartaric acid and an equal equivalent of a diisocyanate compound such as 2,4-tolylene diisocyanate, dimer of 2,4-tolylene diisocyanate, 4,4'-diphenylmethane diisocyanate, 1,5-naphthylene diisocyanate, hexamethylene diisocyanate, trimethylhexamethylene diisocyanate or 4,4'-methylenebis(cyclohexyl isocyanate). Moreover, it is also possible to simultaneously use diol compounds, in the foregoing copolymerization, which do not carry any carboxyl group and may have other substituents non-reactive with the isocyanate compounds. Examples of such diol compounds include ethylene glycol, diethylene glycol, triethylene glycol, neopentyl glycol, 1,3-butylene glycol, bisphenol A, hydrogenated bisphenol A, hydrogenated bisphenol F and ethylene oxide adducts of bisphenol A, but the present invention is not restricted to these specific examples.

Alternatively, the linear polymers (b) may likewise be prepared by co-condensing the foregoing acidic group-containing diols, optional other diols listed above and bifunctional carboxylic acids such as phthalic acid, isophthalic acid, terephthalic acid, fumaric acid, itaconic acid and adipic acid.

The linear polymer has a weight ratio of the acidic group-containing diol monomer units to other monomer units ranging from 2:98 to 80:20 and preferably 5:95 to 70:30.

Examples of the acidic group-containing linear polymers (b) usable in the invention further include phenolic hydroxyl group-containing resins. Specific examples thereof include, but are not limited to, novolak resins such as phenol/formaldehyde resins, m-cresol/formaldehyde resins, p-cresol/formaldehyde resins, o-cresol/formaldehyde resins, m-/p-mixed cresol/formaldehyde resins and phenol/cresol/formaldehyde resins; resol type phenol resins; xylene resins modified with phenol; polyhydroxystyrene, polyhalogenated hydroxystyrenes, and phenolic hydroxyl group-containing acrylic resins.

The molecular weight of these linear polymers in general ranges from 1,000 to 1,000,000 and preferably 1,500 to 200,000.

These acidic group-containing linear polymers may be used alone or in any combination. The amount of the linear polymer added to the light-sensitive composition in general ranges from 1 to 95% by weight and preferably 20 to 90% by weight on the basis of the total solid content of the composition.

The compound capable of being decomposed and hence capable of generating an acid through irradiation with actinic light rays or radiant rays which can be used in the invention may be arbitrarily selected from the group consisting of, for instance, photoinitiators for cationic photopolymerization, photoinitiators for radical photopolymerization, agents for photolytic color-extinction of dyes, photolytic discoloration agents, known compounds which are capable of photolytically generating acids and used in microresists and mixture thereof.

Specific examples thereof include onium salts such as diazonium salts as disclosed in S. I. Schlesinger, Photogr. Sci. Eng., 1974, 18, p. 18 and T. S. Bal et al., Polymer, 1980, 21, p. 423; ammonium salts as disclosed in U.S. Pat. Nos. 4,069,055, 4,069,056 and Re 27,992 and J.P. KOKAI No Hei 4-365049; phosphonium salts as disclosed in D. C. Necker et al., Macromolecules, 1984, 17, p. 2468, C. S. Wen et al., Teh. Proc. Conf. Rad. Curing ASIA, p. 478 Tokyo, October (1988), U.S. Pat. Nos. 4,069,055 and 4,069,056; iodonium salts as disclosed in J. V. Crivello et al., Macromolecules, 1977, 10(6), p. 1307, Chem. & Eng. News, November 28, p. 31 (1988), European Patent No. 104, 143, J.P. KOKAI Nos. Hei 2-150848 and Hei 2-296514; sulfonium salts as disclosed in J. V. Crivello et al., Polymer J., 1985, 17, p. 73, J. V. Crivello et al., J. Org. Chem., 1978, 43, p. 3055, W. R. Watt et al., J. Polymer Sci., Polymer Chem. Ed., 1984, 22, p. 1789, J. V. Crivello et al., Polymer Bull., 1985, 14, p. 279, J. V. Crivello et al., Macromolecules, 1981, 14(5), p. 1141, J. V. Crivello et al., J. Polymer Sci., Polymer Chem. Ed., 1979, 17, p. 2877, European Patent Nos. 370, 693, 3,902,114, 233,567, 297,443 and 297,442, U.S. Pat. Nos. 4,933,377, 4,760,013, 4,734,444 and 2,833,827, and German Patent Nos. 2,904,626, 3,604,580 and 3,604,581; selenonium salts as disclosed in J. V. Crivello et al., Macromolecules, 1977, 10(6), p. 1307 and J. V. Crivello et al., J. Polymer Sci., Polymer Chem. Ed., 1979, 17, P. 1047; and arsonium salts as disclosed in C. S. Wen et al., Teh. Proc. Conf. Rad. Curing ASIA, p. 478 Tokyo, October (1988); compounds capable of generating acids through photolysis such as organic halogen atom-containing compounds as disclosed in U.S. Pat. No. 3,905,815, J.P. KOKOKU No. Sho 46-4605 and J.P. KOKAI Nos. Sho 48-36281, Sho 55-32070, Sho 60-239736, Sho 61-169835, Sho 61-169837, Sho 62-58241, Sho 62-212401, Sho 63-70243 and Sho 63-298339; organometal/organic halogen atom-containing compounds as disclosed in K. Meier et al., J. Rad. Curing, 1986, 13(4), p. 26, T. P. Gill et al., Inorg. Chem., 1980, 19, p. 3007, D. Astruc. Acc. Chem. Res., 1896, 19(12), p. 377 and J.P. KOKAI No. Hei 2-161445; photolytically acid-generating agents having o-nitrobenzyl type protective groups as disclosed in S. Hayase et al., J. Polymer Sci., 1987, 25, p. 753, E. Reichmanis et al., J. Polymer Sci., Polymer Chem. Ed., 1985, 23, p. 1, Q. Q. Zhu et al., J. Photochem., 36, 85, 39, 317 (1987), B. Amit. et al., Tetrahedron Lett., (24) 2205 (1973), D. H. R. Barton et al., J. Chem. Soc., 3571 (1965), P. M. Collins et al., J. Chem. Soc., Perkin I, 1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11(4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130(6), European Patent Nos. 0290,750, 046,083, 156,535, 271,851 and 0,388,343, U.S. Pat. Nos. 3,901,710 and 4,181,531 and J.P. KOKAI Nos. Sho 60-198538 and Sho 53-133022; compounds capable of photolytically generating acids represented by iminosulfonates as disclosed in M. TUNOOKA et al., Polymer Preprints Japan, 38(8), G. Berner et al., J. Rad. Curing, 13(4), W. J. Mijs et al., Coating Technol., 55(697), 45 (1983), Akzo, H. Adachi et al., Polymer Preprints, Japan, 37(3), European Patent Nos. 0199,672, 84515, 199,672, 044,115 and 0101,122, U.S. Pat. Nos. 4,618,564, 4,371,605 and 4,431,774, J.P. KOKAI Nos. Sho 64-18143, Hei 2-245756 and Hei 4-365048; and disulfone compounds as disclosed in J.P. KOKAI No. Sho 61-166544.

It is also possible to use polymers wherein the foregoing photolytically acid-generating groups or compounds are introduced into the main chains or side chains of the polymers, for instance, compounds as disclosed in M. E. Woodhouse et al., J. Am. Chem. Soc., 104, 5586 (1982), S. P. Pappas et al., J. Imaging Sci., 30(5), 218 (1986), S. Kondo et al., Makromol. Chem., Rapid Commun., 9, 625 (1988), Y. Yamada et al., Makromol. Chem., 152, 153, 163 (1972), J. V. Crivello et al., J. Polymer Sci., Polymer Chem. Ed., 17, 3845 (1979), U.S. Pat. No. 3,849,137, German Patent No. 3,914,407, J.P. KOKAI Nos. Sho 63-26653, Sho 55-164824, Sho 62-69263, Sho 63-163452, Sho 62-153853 and Sho 63-146029.

Moreover, compounds usable in the composition of the invention include photolytically acid-generating compounds disclosed in V. N. R. Pillai, Synthesis, (1), 1 (1980), A. Abad et al., Tetrahedron Lett., (47) 4555 (1971), D. H. R. Barton et al., J. Chem. Soc., (C), 329 (1970), U.S. Pat. No. 3,779;778 and European Patent No. 126,712.

Among the foregoing compounds capable of generating acids through irradiation with actinic light rays or radiant rays, those particularly effective in the invention will be detailed below.

(1) Oxazole derivatives represented by the following general formula (VIII) or s-triazine derivatives represented by the following general formula (IX), substituted with trihalomethyl groups:

(VIII)

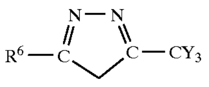

(IX)

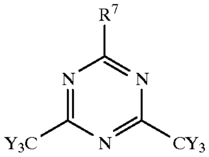

wherein $R^6$ represents a substituted or unsubstituted aryl or alkenyl group and $R^7$ represents a substituted or unsubstituted aryl, alkenyl or alkyl group or a group: —$CY_3$. The substituent Y herein represents a chlorine or bromine atom.

As specific examples of the foregoing oxazole derivatives (VIII) or s-triazine derivatives (IX), there may be mentioned, for instance, compounds VIII-1 to VIII-8 and compounds IX-1 to IX-10 listed below, but the present invention is by no means limited to these specific examples.
(VIII-1)
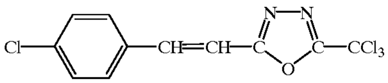
(VIII-2)
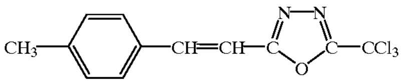
(VIII-3)
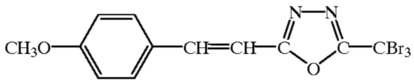
(VIII-4)
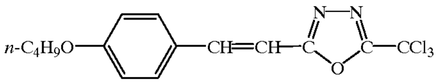
(VIII-5)
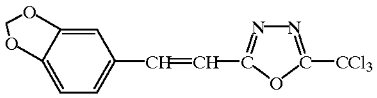
(VIII-6)
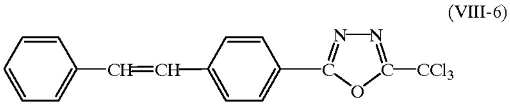
(VIII-7)
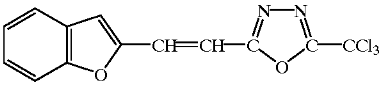
(VIII-8)
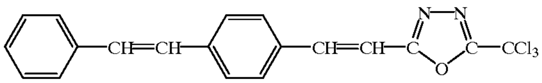
(IX-1)
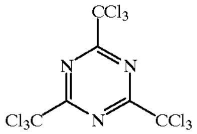
(IX-2)
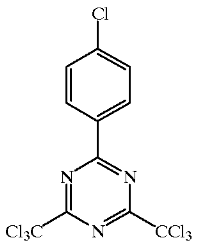
(IX-3)
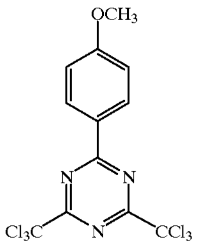
-continued
(IX-4)
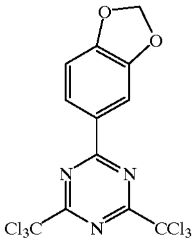
(IX-5)
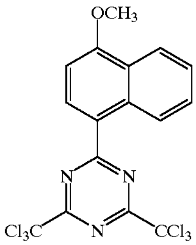
(IX-6)
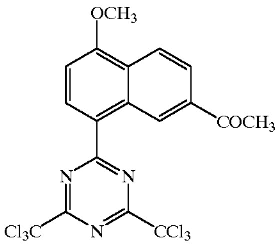
(IX-7)
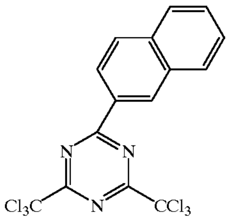
(IX-8)
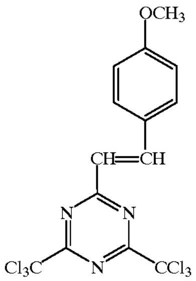
(IX-9)
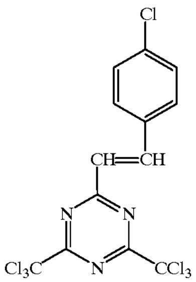

-continued (IX-10)

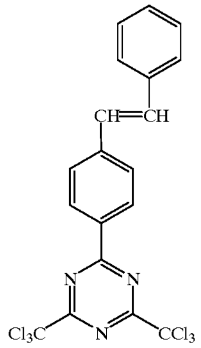

(2) Iodonium salts represented by the following general formula (X) or sulfonium salts represented by the following general formula (XI):

$$Ar^1Ar^2I^+Z^- \quad (X)$$

$$R^8R^9R^{10}S^+Z^- \quad (XI)$$

wherein $Ar^1$ and $Ar^2$ each independently represents a substituted or unsubstituted aryl group. Preferred substituents for the aryl group include, for instance, alkyl, haloalkyl, cycloalkyl, aryl, alkoxy, nitro, carboxyl, alkoxycarbonyl, hydroxyl, mercapto groups and/or halogen atoms.

The substituents $R^8$, $R^9$ and $R^{10}$ each independently represents a substituted or unsubstituted alkyl or aryl group, with aryl groups having 6 to 14 carbon atoms, alkyl groups having 1 to 8 carbon atoms or substituted derivatives thereof being preferred. Examples of preferred substituents are alkoxy groups having 1 to 8 carbon atoms, alkyl groups having 1 to 8 carbon atoms, nitro group, carboxyl group, hydroxyl group and/or halogen atoms for the aryl group, and alkoxy groups having 1 to 8 carbon atoms, carboxyl group and/or alkoxycarbonyl groups for the alkyl group.

$Z^-$ represents a counter anion, for instance, $BF_4^-$, $AsF_6^-$, $PF_6^-$, $SbF_6^-$, $SiF_6^-$, $ClO_4^-$, $CF_3SO^-$, $BPh_4^-$ (Ph=phenyl group); group); a condensed polynuclear aromatic sulfonate anion such as a naphthalene-1-sulfonate anion or an anthraquinonesulfonate anion; or an anion of a sulfonate group-containing dye, but the present invention is not restricted to these specific examples.

Moreover, any two of the substituents $R^8$, $R^9$ and $R^{10}$, and the substituents $Ar^1$ and $Ar^2$ may be linked through a single bond or a divalent substituent.

The foregoing onium salts represented by Formulas (X) and (XI) are known in the art and can be prepared by, for instance, methods as disclosed in J. W. Knapczyk et al., J. Am. Chem Soc., 91, 145 (1969); A. L. Maycok et al., J. Org. Chem., 35, 2532 (1970); E. Goethas et al., Bull. Soc. Chem. Belg., 73, 546 (1964); H. M. Leicester, J. Am. Chem. Soc., 51, 3587 (1929); J. B. Crivello et al., J. Polymer Chem. Ed., 18, 2677 (1980); U.S. Pat. Nos. 2,807,648 and 4,247,473; and J.P. KOKAI No. Sho 53-101331.

Specific examples of the onium salts represented by Formulas (X) and (XI) are compounds X-1 to X-22 and compounds XI-1 to XI-34 listed below, but the present invention is by no means limited to these specific compounds.

(X-1)

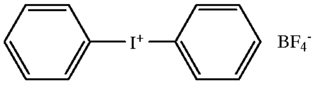

(X-2)

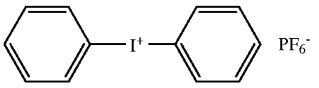

(X-3)

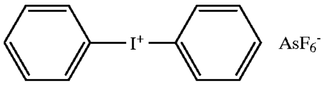

(X-4)

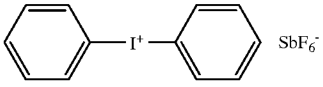

(X-5)

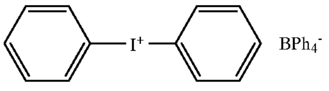

(X-6)

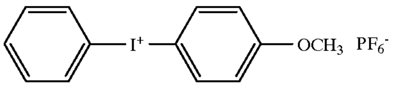

(X-7)

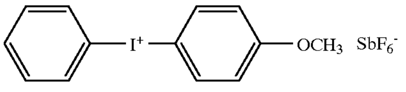

(X-8)

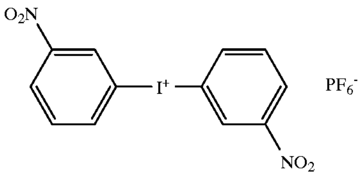

(X-9)

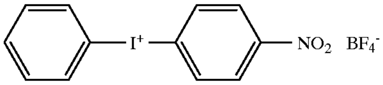

(X-10)

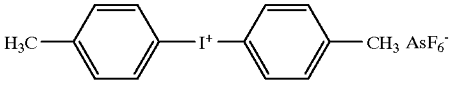

(X-11)

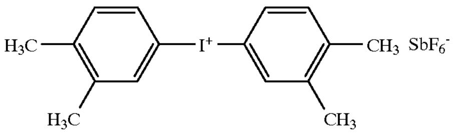

(X-12)

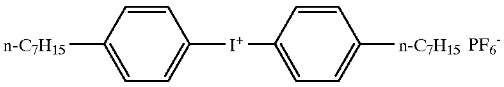

(X-13)

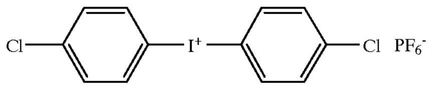

-continued
(X-14)
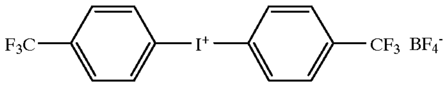
(X-15)
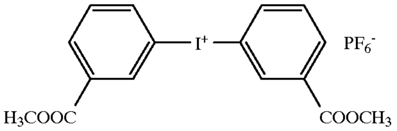
(X-16)
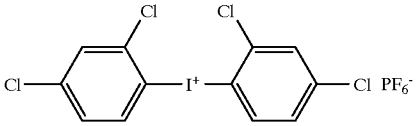
(X-17)
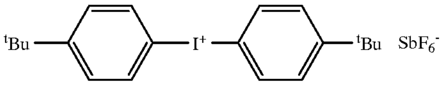
(X-18)
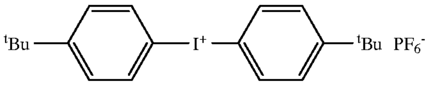
(X-19)
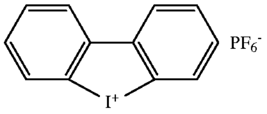
(X-20)
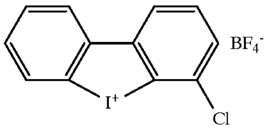
(X-21)
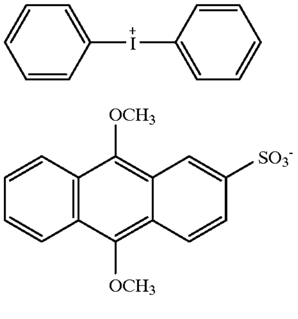
(X-22)
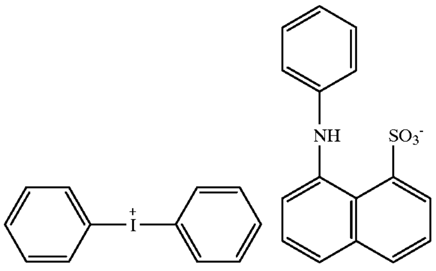
-continued
(XI-1)
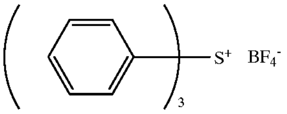
(XI-2)
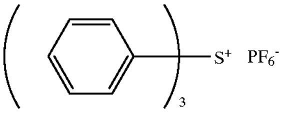
(XI-3)
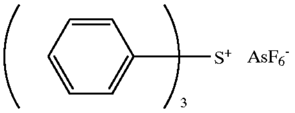
(XI-4)
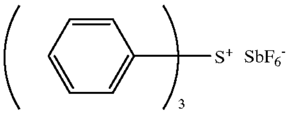
(XI-5)
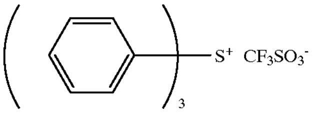
(XI-6)
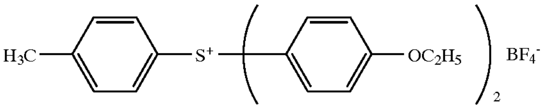
(XI-7)
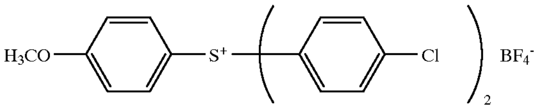
(XI-8)
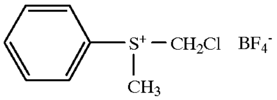
(XI-9)
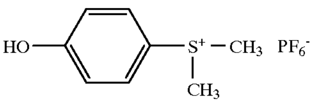
(XI-10)
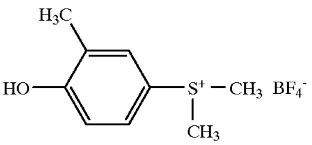
(XI-11)
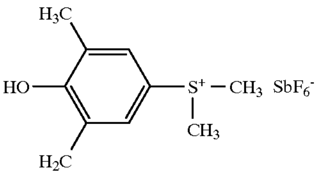

-continued
(XI-12)
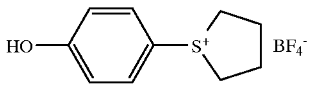
(XI-13)
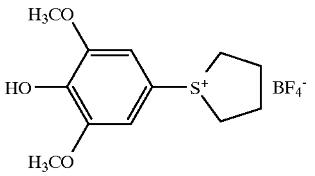
(XI-14)
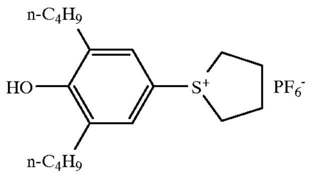
(XI-15)
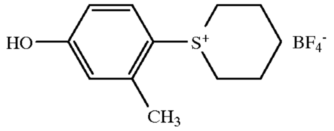
(XI-16)
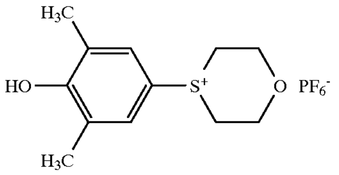
(XI-17)
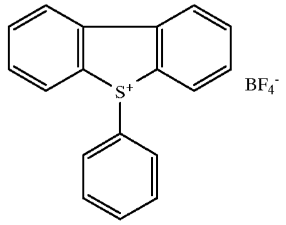
(XI-18)
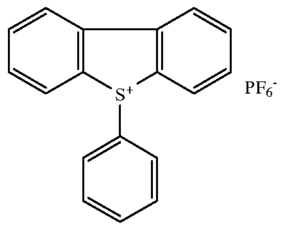
(XI-19)
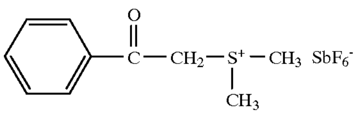
-continued
(XI-20)
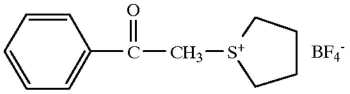
(XI-21)
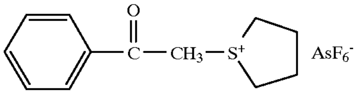
(XI-22)
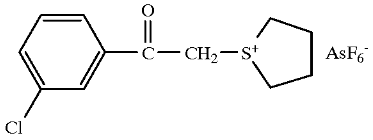
(XI-23)
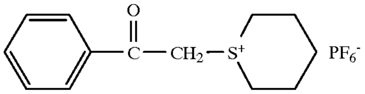
(XI-24)
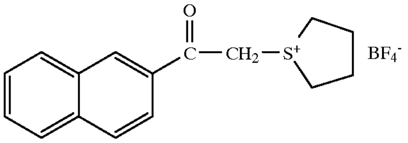
(XI-25)
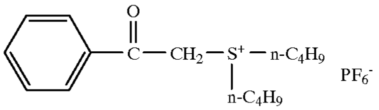
(XI-26)
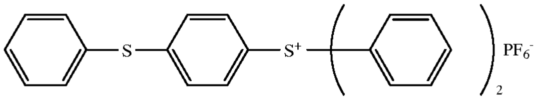
(XI-27)
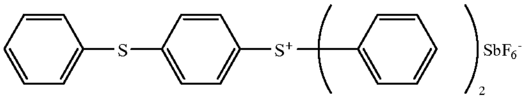
(XI-28)
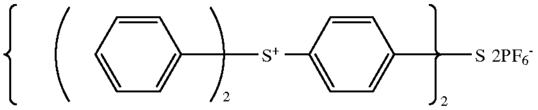
(XI-29)
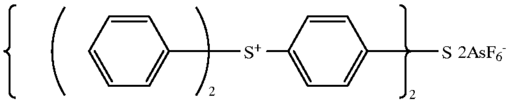
(XI-30)
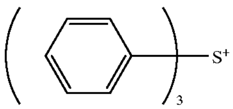

-continued

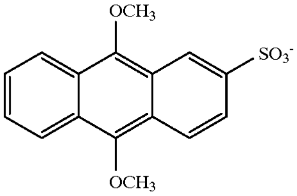

(XI-31)

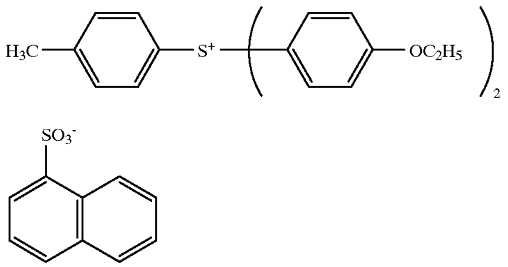

(XI-32)

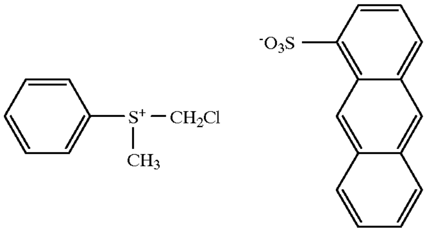

(XI-33)

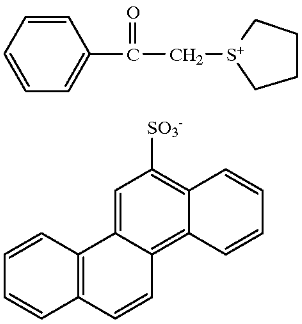

(XI-34)

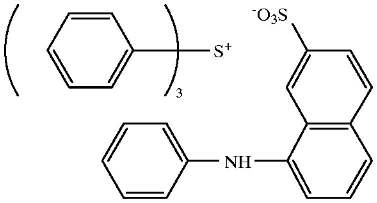

(3) Disulfone derivatives represented by the following general formula (XII) or iminosulfonate derivatives represented by the following general formula (XIII):

(XII)

$$Ar^3-SO_2-SO_2-Ar^4$$

-continued (XIII)

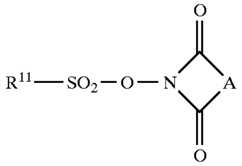

wherein $Ar^3$ and $Ar^4$ each independently represents a substituted or unsubstituted aryl group. $R^{11}$ represents a substituted or unsubstituted alkyl or aryl group. A represents a substituted or unsubstituted alkylene, alkenylene or arylene group.

Specific examples of the compounds represented by Formulas (XII) and (XIII) include, but are not limited to, compounds XII-1 to XII-12 and compounds XIII-1 to XIII-12 listed below.

(XII-1)

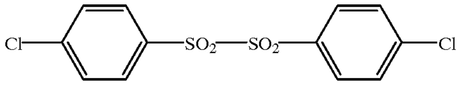

(XII-2)

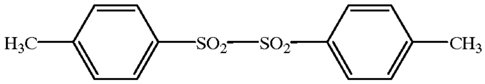

(XII-3)

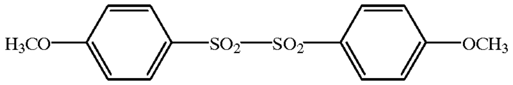

(XII-4)

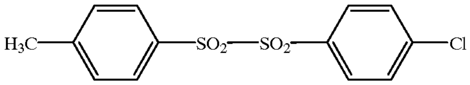

(XII-5)

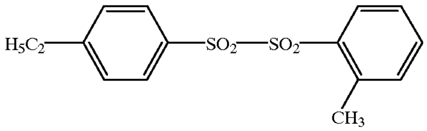

(XII-6)

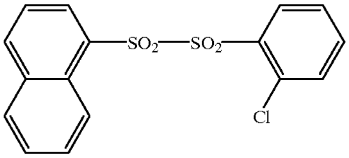

(XII-7)

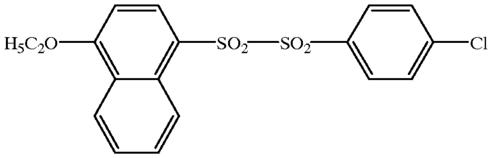

(XII-8)

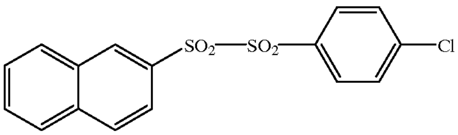

-continued (XII-9)

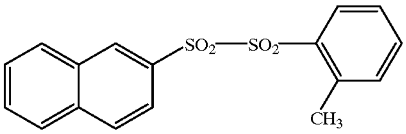

(XII-10)

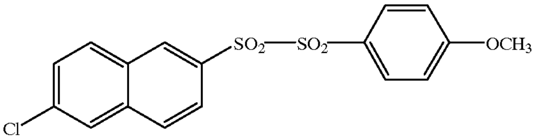

(XII-11)

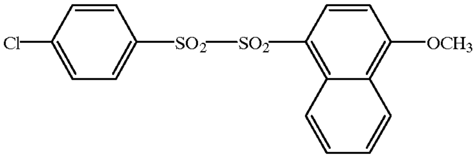

(XII-12)

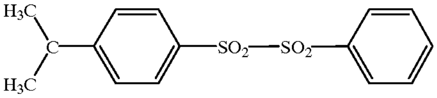

(XIII-1)

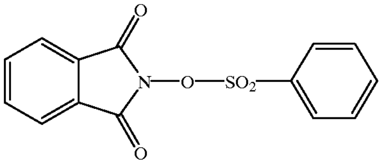

(XIII-2)

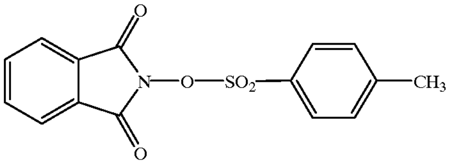

(XIII-3)

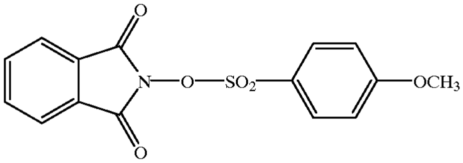

(XIII-4)

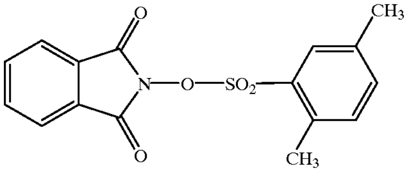

(XIII-5)

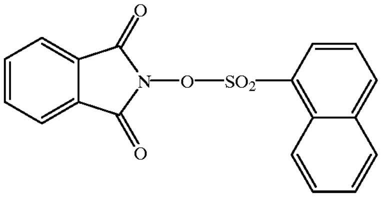

-continued (XIII-6)

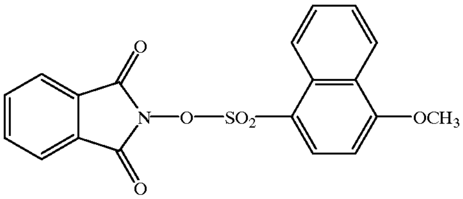

(XIII-7)

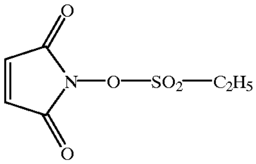

(XIII-8)

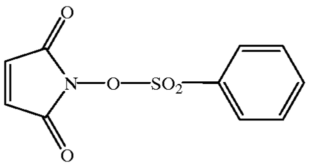

(XIII-9)

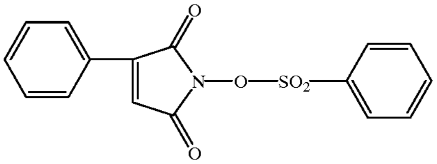

(XIII-10)

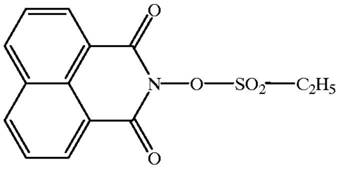

(XIII-11)

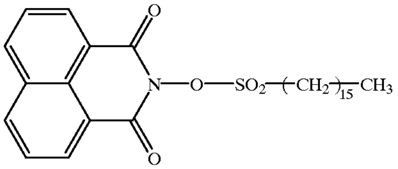

(XIII-12)

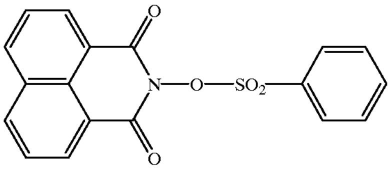

These compounds capable of being decomposed and generating acids through irradiation with actinic light rays or radiant rays may be used alone or in combination and may be added to the light-sensitive composition in an amount generally ranging from 0.001 to 40% by weight and preferably 0.1 to 20% by weight on the basis of the total solid content of the composition.

Moreover, the positive-working light-sensitive composition of the present invention may optionally comprise a compound capable of improving the photolytically acid-generating efficiency of the acid-generating compound (sensitizer), a dye, a pigment, a plasticizer and various kinds of compounds for adjusting the solubility of the positive-working light-sensitive composition in an alkaline aqueous solution.

Examples of such sensitizers include, but are not limited to, electron donative compounds such as pyrene and perylene or dyes such as merocyanine dyes and cyanine dyes.

These sensitizers may be used alone or in combination and the ratio thereof to the component (b) preferably ranges from 0.01/1 to 20/1 expressed in terms of the molar ratio and 0.1/1 to 5/1 expressed in terms of the weight ratio.

In addition, a dye may be used in the positive-working light-sensitive composition of the invention as a coloring agent and preferred dyes include, for instance, oil-soluble dyes or basic dyes. Specific examples thereof are Oil Yellow #101 and #130, Oil Pink #312, Oil Green BG, Oil Blue BOS, Oil Black BY, BS and T-505 (they are all available from Oriental Chemical Industry Co., Ltd.); Crystal Violet (CI 42555), Methyl Violet (CI 42535), Rhodamine B (CI 45170B), Malachite Green (CI 42000) and Methylene Blue (CI 52015).

These dyes may be used alone or in combination and can be added to the light-sensitive composition in an amount ranging from 0.01 to 10% by weight and preferably 0.1 to 3% by weight on the basis of the total solid content of the composition.

The compounds for adjusting the solubility of the positive-working light-sensitive composition of the present invention in an alkaline aqueous solution may be cyclic acid anhydrides and other fillers.

Examples of such cyclic acid anhydrides are phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic anhydride, α-phenylmaleic anhydride, succinic anhydride and pyromellitic anhydride as disclosed in U.S. Pat. No. 4,115,128. These acid anhydrides may be used alone or in combination and may be added to the light-sensitive composition in an amount ranging from 1 to 15% by weight on the basis of the total solid content of the composition. The sensitivity of the composition can be increased up to at most about three times through the addition of these acid anhydrides.

It is also possible to use compounds, which can be made alkali-soluble through hydrolysis with acids, such as those disclosed in, for instance, J.P. KOKAI Nos. Sho 62-27829, Sho 63-250642, Sho 63-139343, Hei 4-63846, Hei 4-70021, Hei 4-67677, Sho 60-191372, Sho 48-39003, Sho 51-120714, Sho 53-133429, Sho 55-126236, Hei 1-106038 and Sho 64-57258 in order to increase the difference in solubility between exposed and unexposed portions of the composition.

If the positive-working light-sensitive composition of the present invention is used as a material for making a lithographic printing plate, the foregoing components are dissolved in a solvent capable of dissolving these components and then applied onto the surface of a substrate. Alternatively, if the composition is used as a resist material for semiconductors, it is used in the form of a solution dissolved in a solvent. Examples of solvent usable in the invention include ethylene dichloride, cyclohexanone, methyl ethyl ketone, methanol, ethanol, propanol, ethylene glycol monomethyl ether, 1-methoxy-2-propanol, ethylene glycol monoethyl ether, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene, ethyl acetate and dioxane. These solvent may be used alone or in combination.

The concentration of the foregoing components (total solid content inclusive of the foregoing additives) in the solvent preferably ranges from 2 to 50% by weight. Moreover, if the composition is applied onto a substrate, the amount thereof to be applied varies depending on applications, but in general preferred amount thereof ranges from 0.5 to 3.0 $g/m^2$ for presensitized plate for use in making a lithographic printing plate (hereinafter referred to as "PS plate") and 0.1 to 3.0 $g/m^2$ when it is used as a photoresist. As the coated amount thereof decreases, the sensitivity of the resulting film increases, but the properties of the resulting film are impaired.

When preparing a lithographic printing plate using the positive-working light-sensitive composition of the invention, substrates for the printing plate may be, for instance, paper; paper laminated with a plastic film (such as a polyethylene, polypropylene or polystyrene film); metal plates such as aluminum (including aluminum alloys), zinc and copper plates; plastic films such as cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal films; and paper or plastic films laminated with films of the foregoing metals or on which the foregoing metals are vapor-deposited. Among these substrates, particularly preferred are aluminum plates because of their high dimensional stability and cheapness. Examples of preferred substrates further include composite sheets comprising polyethylene terephthalate films and aluminum sheets bonded thereto as disclosed in J.P. KOKOKU No. Sho 48-18327. Preferably, the aluminum plate is surface-grained by a mechanical method such as wire brush graining, brush graining which comprises surface-graining with a nylon brush while pouring a slurry containing abrasive particles, ball graining, graining by liquid honing or buff graining; a chemical graining method which makes use of HF, $AlCl_3$ or HCl as an etchant; an electrolytic graining method in which nitric acid or hydrochloric acid is used as an electrolyte or a composite graining method comprising a combination of at least two of these surface-roughening methods, optionally etched with an acid or an alkali and then anodized by passing a direct or alternating current therethrough in an electrolyte selected from sulfuric acid, phosphoric acid, chromic acid, sulfamic acid or mixture thereof to form a firm passivation film on the surface of the aluminum plate.

Moreover, the aluminum plate is preferably subjected to sealing treatment after the surface-graining and anodization treatments. Such a sealing treatment is performed by immersing the aluminum plate in hot water, a hot aqueous solution containing an inorganic or organic salt or by treating the plate in a steam bath.

The surface of the aluminum plate is converted into a hydrophilic one through the application of such a passivation film onto the surface, but a particularly preferred aluminum plate is further subjected to a hydrophilization treatment such as a treatment with a silicate (e.g., sodium or potassium silicate) as disclosed in U.S. Pat. Nos. 2,714,066 and 3,181,461; a treatment with potassium fluorozirconate as disclosed in U.S. Pat. No. 2,946,638; a treatment with phosphomolybdate as disclosed in U.S. Pat. No. 3,201,247; a treatment with an alkyl titanate as disclosed in U.K. Patent No. 1,108,559; a treatment with polyacrylic acid as disclosed in German Patent No. 1,091,443; a treatment with polyvinylsufonic acid as disclosed in German Patent No. 1,134,093 and U.K. Patent No. 1,230,447; a treatment with a phosphonic acid as disclosed in J.P. KOKOKU No. Sho 44-6409; a treatment with a phytic acid as disclosed in U.S. Pat. No. 3,307,951; application of an underlying coating of a complex comprising a hydrophilic organic polymer and divalent metal ions as disclosed in J.P. KOKAI Nos. Sho 58-16893 and Sho 58-16291; and application of an underlying coating of a water-soluble polymer having sulfonate groups as disclosed in J.P. KOKAI No. Sho 59-101651. Examples of other hydrophilization treatments usable in the invention include silicate electrodeposition as disclosed in U.S. Pat. No. 3,658,662.

The positive-working light-sensitive composition of the invention is applied onto the surface of a substrate by a known coating technique. Examples of the coating techniques include coating with a whirler, coating with a wire bar, dip coating, air knife coating, roller coating, blade coating, curtain coating and spray coating.

The layer of the positive-working light-sensitive composition applied onto the substrate in the foregoing manner is dried at a temperature ranging from 40 to 150° C. for 30 seconds to 10 minutes using, for instance, a hot-air dryer or an infrared dryer. The crosslinking of the components (a) and (b) can be performed by, for instance, applying heat during application of the light-sensitive composition and/or during drying the applied layer of the composition or by applying heat after the application and drying of the composition. The layer of the composition is heated at a temperature preferably ranging from 60 to 150° C., more preferably 80 to 130° C. for 5 seconds to 20 minutes and preferably 20 seconds to 5 minutes.

If the positive-working light-sensitive composition of the invention is used as a photoresist, various substrates may be used, for instance, a copper plate, a copper-plated plate, a silicon plate, a stainless steel plate and a glass plate.

The PS plate, photoresist or the like comprising the positive-working light-sensitive composition of the invention are in general subjected to imagewise exposure to light and a subsequent development process.

The imagewise exposure to light may be performed using various sources for actinic light rays such as a mercury lamp, a metal halide lamp, a xenon lamp, a chemical lamp and a carbon arc lamp. Radiant rays may likewise be used for the imagewise exposure process and examples of the radiant rays include electron beam, X-rays, ion beam and far ultraviolet rays. In addition, light sources for photoresists preferably include, for instance, g-rays, i-rays and Deep-UV rays. Moreover, scanning exposure techniques which make use of high density energy beams (such as laser beams or electron beams) may likewise be used in the present invention. Examples of such laser beams include those emitted from He—Ne lasers, argon lasers, krypton ion lasers, He—Cd lasers and KrF excimer lasers.

Developers suitably used in the development of the positive-working light-sensitive composition of the present invention include, for instance, aqueous solutions of inorganic alkaline agents such as sodium silicate, potassium silicate, sodium hydroxide, potassium hydroxide, lithium hydroxide, sodium tertiary phosphate, sodium secondary phosphate, ammonium tertiary phosphate, ammonium secondary phosphate, sodium metasilicate, sodium bicarbonate and aqueous ammonia; and organic alkaline agents such as tetraalkyl ammonium hydrides and the concentration of these aqueous alkaline solutions in general ranges from 0.1 to 10% by weight and preferably 0.5 to 5% by weight.

The alkaline aqueous solution may optionally comprise a surfactant and/or an organic solvent such as an alcohol.

The positive-working light-sensitive composition has high light-sensitivity and permits the use of light rays extending over a wide range of wavelengths. Therefore, the positive-working light-sensitive composition of the present invention can provide clear positive images and has a wide development latitude.

The present invention will hereunder be explained in more detail with reference to the following non-limitative working Examples and the effects practically attained by the present invention will also be discussed in detail in comparison with Comparative Examples.

EXAMPLES 1 to 23 AND COMPARATIVE EXAMPLES 1 to 3

A 2S aluminum plate having a thickness of 0.24 mm was immersed in a 10% sodium tertiary phosphate aqueous solution maintained at 80° C. for 3 minutes for degreasing, then surface-grained by rubbing it with a nylon brush, etched with sodium aluminate for about 10 minutes and desmutted with a 3% aqueous solution of sodium hydrogen sulfate. The aluminum plate was anodized at a current density of 2 $A/dm^2$ for 2 minutes in a 20% aqueous sulfuric acid solution.

Twenty six kinds of light-sensitive solutions [A]-1 to [A]-23 and [A']-1 to [A']-3, each having a formulation given below, were prepared using compounds listed in the following Table 1. Each light-sensitive solution was applied onto the surface of the anodized aluminum plate and dried at 100° C. for 10 minutes to give each corresponding PS plate. In all of the PS plates thus prepared, the coated amount of each light-sensitive solution was adjusted to 1.7 $g/m^2$ (determined after drying).

Light-Sensitive Solution [A]

| | |
|---|---|
| linear polymer listed in Table 1 | 2.0 g |
| vinyl ether compound listed in Table 1 | 0.4 g |
| photolytically acid-generating agent listed in Table 1 | 0.1 g |
| dioxane | 50.0 g |
| methanol | 15.0 g |

To confirm whether, or not, the light-sensitive layer had been crosslinked by the heat applied during the drying step, each resulting PS plate was immersed in a solvent listed in the following Table 2 for 5 minutes, then washed with water and inspected for the condition of the dissolved coated film. The results thus obtained are summarized in Table 2. In Table 2, the coated film was completely insoluble in the solvent (A), partially dissolved in the solvent (B) or completely dissolved therein (C).

Then a gray scale having an optical density difference of 0.15 was brought into close contact with the light-sensitive layer of each resulting PS plate and the resulting assembly was exposed to light from a 2 KW high pressure mercury lamp for 20 seconds at a distance of 50 cm. The exposed PS plates each was heated to 120° C. for 5 minutes and then developed by immersing in a stock solution (Y) for developer having the following composition, which was diluted two times with water prior to use, at 25° C. for 60 seconds. As a result, all of the light-sensitive compositions of the present invention provided clear positive images. The results thus obtained are listed in the following Table 3.

Stock Solution of Developer (Y)

| | |
|---|---|
| water | 80 g |
| triethanolamine | 3 g |
| sodium t-butylnaphthalenesulfonate | 8 g |
| benzyl alcohol | 9 g |

TABLE 1

| Ex. No. | Light-sensitive Solution | Linear Polymer | Vinyl Ether Compound | Acid-generating Agent |
|---|---|---|---|---|
| 1 | [A]-1 | P-1 | II-11 | X-21 |
| 2 | [A]-2 | P-2 | II-11 | X-21 |
| 3 | [A]-3 | P-3 | II-11 | X-21 |
| 4 | [A]-4 | P-4 | II-11 | X-21 |
| 5 | [A]-5 | P-5 | II-11 | X-21 |
| 6 | [A]-6 | P-6 | II-11 | X-21 |
| 7 | [A]-7 | P-7 | II-11 | X-21 |
| 8 | [A]-8 | P-8 | II-11 | X-21 |
| 9 | [A]-9 | P-9 | II-11 | X-21 |
| 10 | [A]-10 | P-10 | II-11 | X-21 |
| 11 | [A]-11 | P-11 | II-11 | X-21 |
| 12 | [A]-12 | P-12 | II-11 | X-21 |
| 13 | [A]-13 | P-2 | II-11 | XI-32 |
| 14 | [A]-14 | P-2 | II-9 | X-21 |
| 15 | [A]-15 | P-2 | II-35 | X-21 |
| 16 | [A]-16 | P-2 | VII-9 | XI-32 |
| 17 | [A]-17 | P-2 | VII-11 | X-21 |
| 18 | [A]-18 | P-2 | VII-3 | X-22 |
| 19 | [A]-19 | P-2 | VII-6 | X-22 |
| 20 | [A]-20 | P-2 | VII-13 | VIII-3 |
| 21 | [A]-21 | P-2 | II-11 | IX-8 |
| 22 | [A]-22 | P-2 | II-4 | XII-10 |
| 23 | [A]-23 | P-2 | II-17 | XIII-12 |
| Comp.Ex. | | | | |
| 1 | [A']-1 | P-2 | II-11 | None |
| 2 | [A']-2 | P-2 | None | X-21 |
| 3 | [A']-3 | P'-1 | II-11 | X-21 |

P-1: methacrylic acid/methyl methacrylate/ethyl acrylate = 20/55/25 (% by weight); molecular weight Mw = 43,000.
P-2: acrylic acid/methyl methacrylate/ethyl acrylate 20/60/20 (% by weight); molecular weight Mw = 48,000.
P-3: methacrylic acid/benzyl methacrylate = 30/70 (% by weight); molecular weight Mw = 23,000.
P-4: acrylic acid/benzyl methacrylate = 30/70 (% by weight); molecular weight Mw = 29,000.
P-5: methacrylic acid/benzyl methacrylate/2-hydroxyethyl methacrylate = 50/30/20 (% by weight); molecular weight Mw = 37.000.
P-6: methacrylic acid/methyl methacrylate/2-hydroxyethyl methacrylate/acrylonitrile = 5/25/35/35 (% by weight); molecular weight Mw 29,000.
P-7: vinyl benzoate/methyl methacrylate/ethyl acrylate = 20/60/20 (% by weight); molecular weight Mw = 37,000.
P-8: the polymer represented by the following formula a; molecular weight Mw = 30,000.
P-9: p-hydroxystyrene/vinyl toluene = 50/50 (% by weight); molecular weight Mw = 2,000.
P-10: the polymer represented by the following formula b; molecular weight Mw = 28,000.
P-11: the Polyurethane resin prepared by reacting the following monomers in the ratio given in the following formula c; molecular weight Mw = 21,000.
P-12: the polyurethane resin prepared by reacting the following monomers in the ratio given in the following formula d; molecular weight Mw = 38,000.
P'-1: 2-hydroxyethyl methacrylate/benzyl methacrylate = 20/80 (% by weight); molecular weight Mw = 43,000.

TABLE 1-continued

| Ex. No. | Light-sensitive Solution | Linear Polymer | Vinyl Ether Compound | Acid-generating Agent |
|---|---|---|---|---|

a 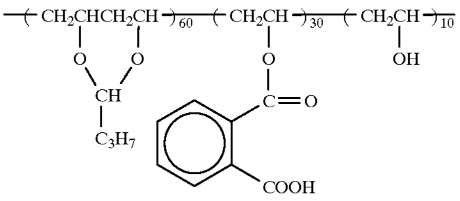

b 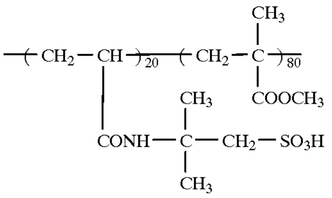

c 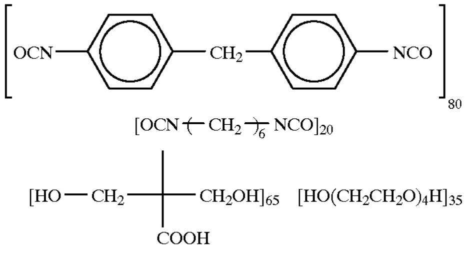

d 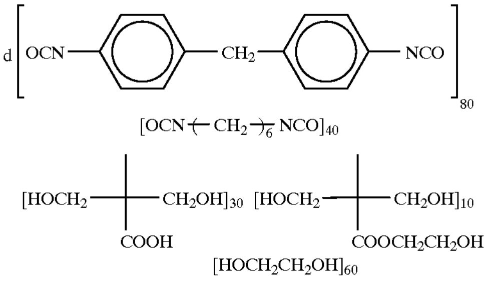

TABLE 2

| | Solubility of Dried Coated Films | | | |
|---|---|---|---|---|
| | Stock Soln. Y/water (1/2) | Methyl Ethyl Ketone | Dioxane | Toluene |
| Ex. No. | | | | |
| 1 | A | A | A | A |
| 2 | A | A | A | A |
| 3 | A | A | A | A |
| 4 | A | A | A | A |
| 5 | A | A | A | A |
| 6 | A | A | A | A |
| 7 | A | A | A | A |
| 8 | A | A | A | A |
| 9 | A | A | A | A |
| 10 | A | A | A | A |
| 11 | A | A | A | A |
| 12 | A | A | A | A |
| 13 | A | A | A | A |
| 14 | A | A | A | A |
| 15 | A | A | A | A |

TABLE 2-continued

| | Solubility of Dried Coated Films | | | |
|---|---|---|---|---|
| | Stock Soln. Y/water (1/2) | Methyl Ethyl Ketone | Dioxane | Toluene |
| 16 | A | A | A | A |
| 17 | A | A | A | A |
| 18 | A | A | A | A |
| 19 | A | A | A | A |
| 20 | A | A | A | A |
| 21 | A | A | A | A |
| 22 | A | A | A | A |
| 23 | A | A | A | A |
| Comp. Ex. | | | | |
| 1 | A | A | A | A |
| 2 | C | C | C | C |
| 3 | A | C | C | B |

TABLE 3

| | Quality of Images Formed | Step No. of Gray Scale |
|---|---|---|
| Ex. No. | | |
| 1 | Clear Positive Images | 10 |
| 2 | Clear Positive Images | 9 |
| 3 | Clear Positive Images | 10 |
| 4 | Clear Positive Images | 11 |
| 5 | Clear Positive Images | 10 |
| 6 | Clear Positive Images | 5 |
| 7 | Clear Positive Images | 6 |
| 8 | Clear Positive Images | 7 |
| 9 | Clear Positive Images | 6 |
| 10 | Clear Positive Images | 6 |
| 11 | Clear Positive Images | 5 |
| 12 | Clear Positive Images | 6 |
| 13 | Clear Positive Images | 8 |
| 14 | Clear Positive Images | 10 |
| 15 | Clear Positive Images | 4 |
| 16 | Clear Positive Images | 7 |
| 17 | Clear Positive Images | 8 |
| 18 | Clear Positive Images | 12 |
| 19 | Clear Positive Images | 13 |
| 20 | Clear Positive Images | 4 |
| 21 | Clear Positive Images | 6 |
| 22 | Clear Positive Images | 8 |
| 23 | Clear Positive Images | 10 |
| Comp. Ex. | | |
| 1 | both exposed and unexposed areas were insoluble. | |
| 2 | both exposed and unexposed areas were dissolved. | |
| 3 | film weight loss was observed for both exposed and unexposed areas (any image was not formed). | |

EXAMPLES 24 to 27

The light-sensitive solutions [A]-1, [A]-4, [A]-6 and [A]-14 each was applied onto the surface of a silicon wafer having a thickness of 2 mm with a spinner and dried at 120° C. for 2 minutes while the film thickness determined after drying was adjusted to 1 g/m$^2$. The resulting resist film was exposed to light using a reduction-projection exposure machine (a stepper) provided with a light source capable of emitting monochromatic light rays of 436 nm and then heated to 120° C. for 3 minutes. The exposed resist film was developed in a 2.4% aqueous solution of tetramethylammonium hydroxide for 60 seconds to give a resist pattern. As a result, it was found out that all of the samples thus formed provided good patterns comprising lines and spaces having widths of 0.7 μm.

EXAMPLE 28

A gray scale having an optical density difference of 0.15 was brought into close contact with the light-sensitive layer of the PS plate prepared in Example 1 and the assembly was exposed to light from a 2 KW high pressure mercury lamp for 20 seconds at a distance of 50 cm. The exposed PS plate was heated at 120° C. for 5 minutes and then developed in Y-3C (trade name of a developer available from Fuji Photo Film Co., Ltd.) diluted two times with water at 25° C. over various development times, i.e., 20 seconds, 30 seconds, one minute, 2 minutes, 5 minutes and 10 minutes. As a result, it was found that good positive images were formed in all of the cases examined and that the number of steps of the gray scale was 13 for all of the cases.

The foregoing results clearly indicate that the positive-working light-sensitive composition of the present invention is highly sensitive, can provide clear positive images and has a wide development latitude.

What is claimed is:

1. A positive-working light-sensitive composition comprising:

(i) a thermally crosslinked product having a crosslinked structure formed through a thermal crosslinking reaction of (a) a vinyl ether compound selected from the group consisting of ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, pentaerythritol tetravinyl ether, sorbitol tetravinyl ether, sorbitol pentavinyl ether, ethylene glycol diethylene vinyl ether, triethylene glycol diethylene vinyl ether, ethylene glycol dipropylene vinyl ether, trimethylolpropane triethylene vinyl ether, trimethylolpropane diethylene vinyl ether, pentaerythritol diethylene vinyl ether, pentaerythritol triethylene vinyl ether, pentaerythritol tetraethylene vinyl ether, 1,2-di-(vinyl ether methoxy)benzene, 1,2-di-(vinyl ether ethoxy)benzene, terephthaloyl diethylene vinyl ether, phthaloyl diethylene vinyl ether, isophthaloyl diethylene vinyl ether, phthaloyl dipropylene vinyl ether, terephthaloyl dipropylene vinyl ether, isophthaloyl dipropylene vinyl ether, maleoyl diethylene vinyl ether, fumaroyl diethylene vinyl ether, itaconoyl diethylene vinyl ether and compounds represented by the following formulas (II-1) to (II-41), (VII-1) to (VII-15):

(II-1)

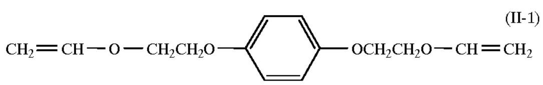

-continued
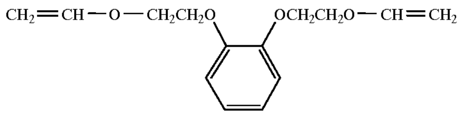
(II-2)
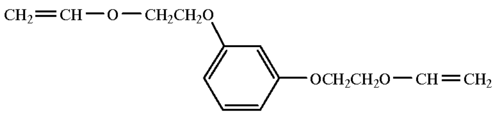
(II-3)
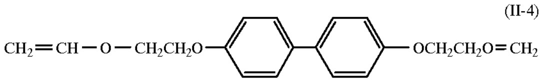
(II-4)
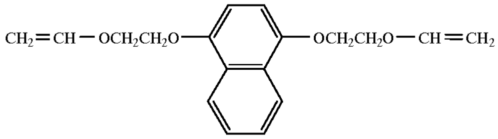
(II-5)
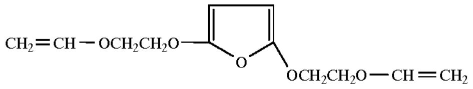
(II-6)
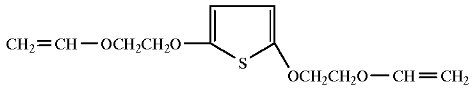
(II-7)
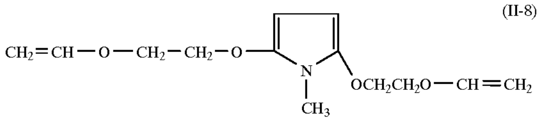
(II-8)
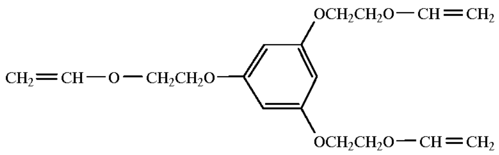
(II-9)
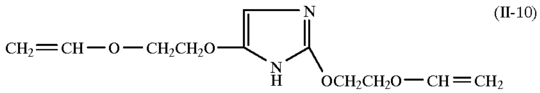
(II-10)
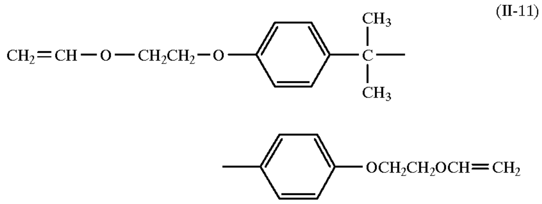
(II-11)
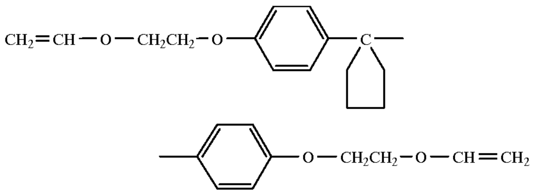
(II-12)
-continued
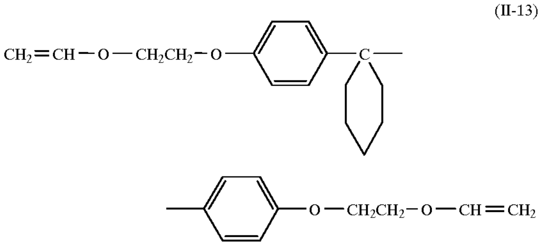
(II-13)
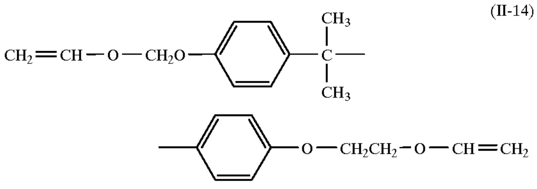
(II-14)
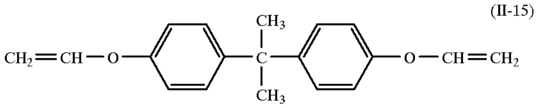
(II-15)
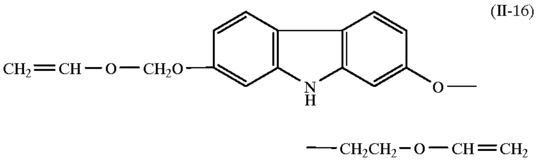
(II-16)
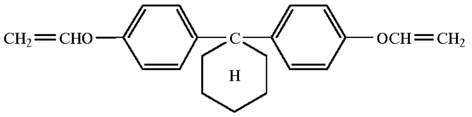
(II-17)
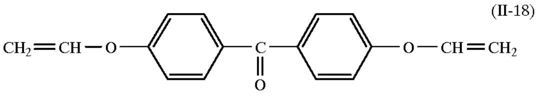
(II-18)
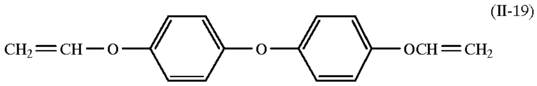
(II-19)
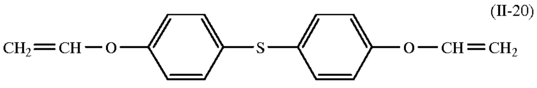
(II-20)
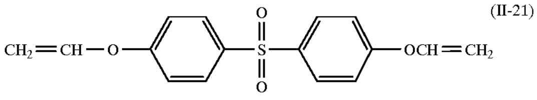
(II-21)
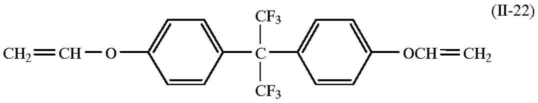
(II-22)

-continued
(II-23)
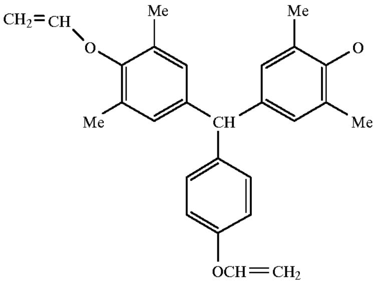
(II-24)
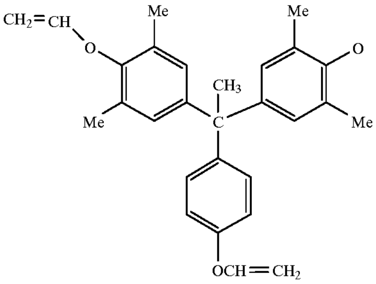
(II-25)
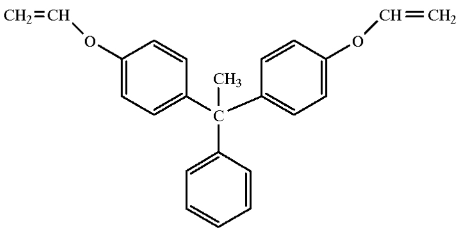
(II-26)
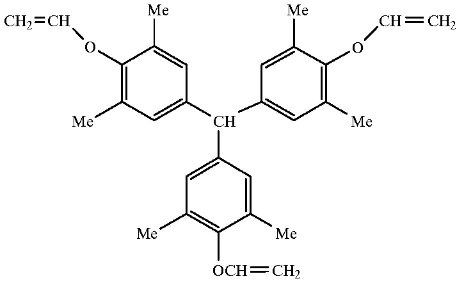
(II-27)
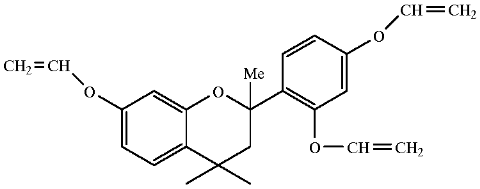
(II-28)
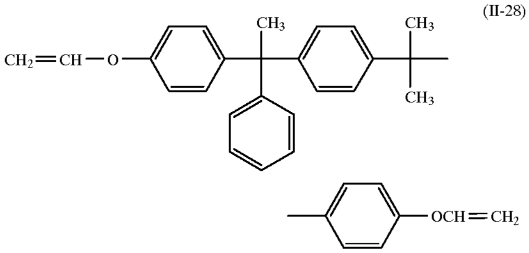
-continued
(II-29)
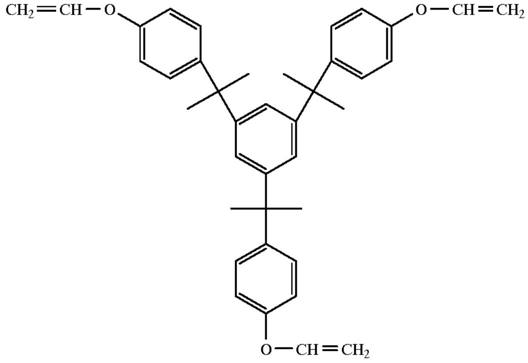
(II-30)
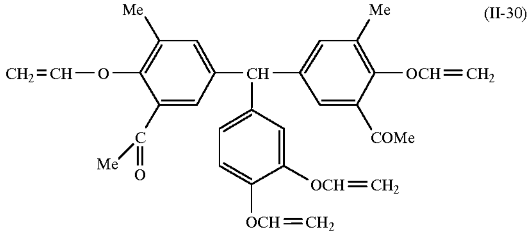
(II-31)
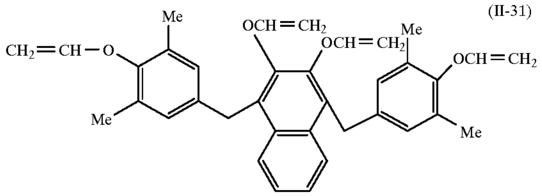
(II-32)
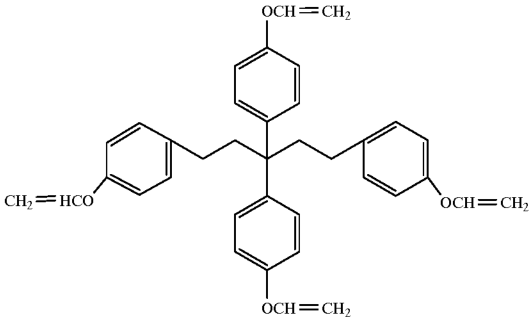
(II-33)
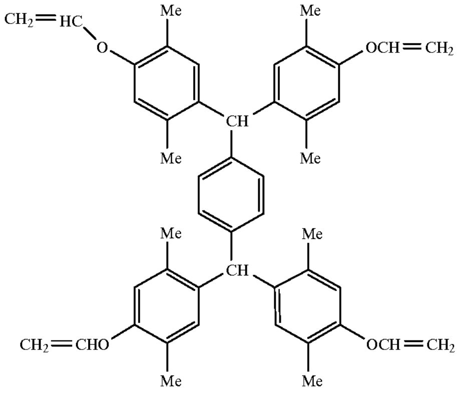

-continued
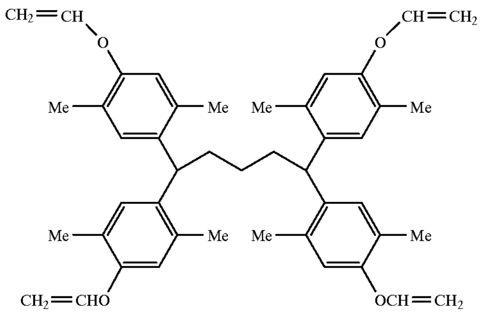
(II-34)
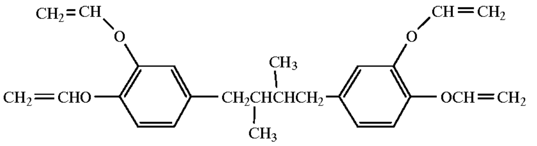
(II-35)
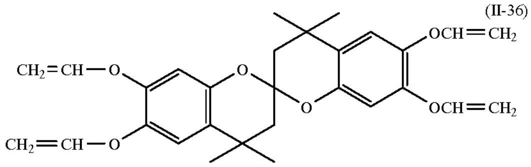
(II-36)
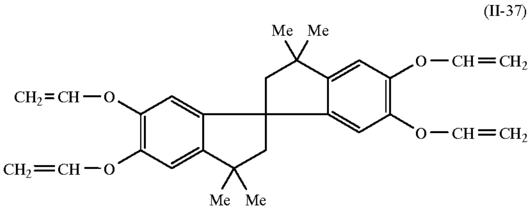
(II-37)
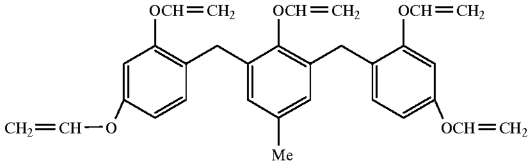
(II-38)
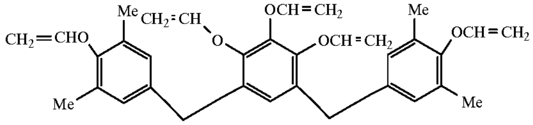
(II-39)
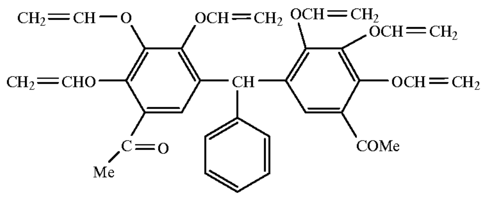
(II-40)
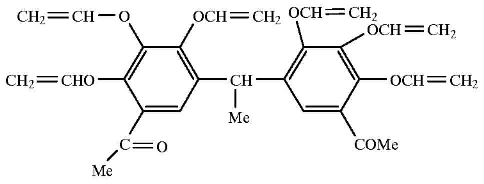
(II-41)
-continued
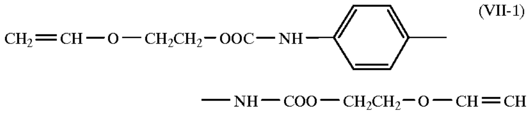
(VII-1)
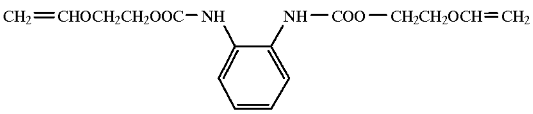
(VII-2)
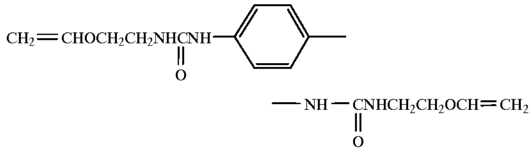
(VII-3)
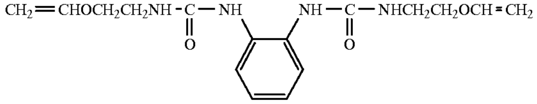
(VII-4)
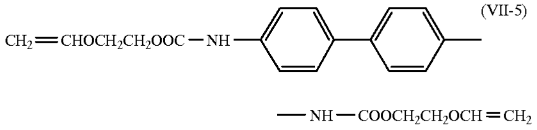
(VII-5)
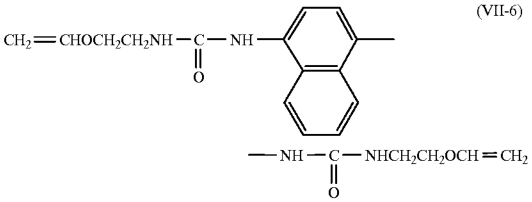
(VII-6)
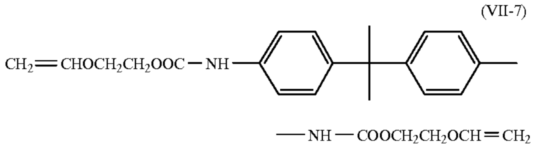
(VII-7)
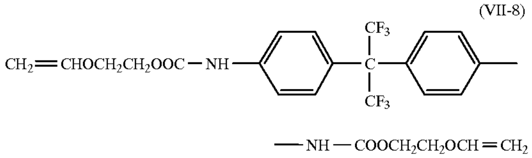
(VII-8)
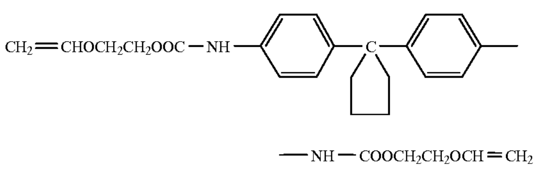
(VII-9)

-continued (VII-10)

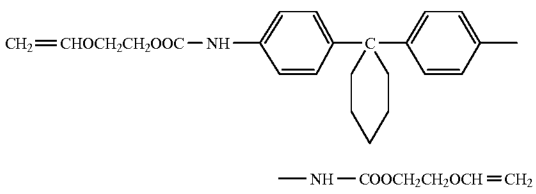

(VII-11)

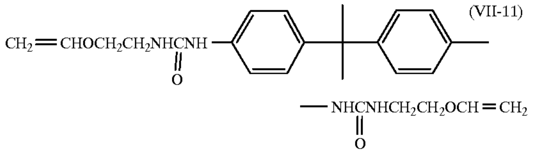

(VII-12)

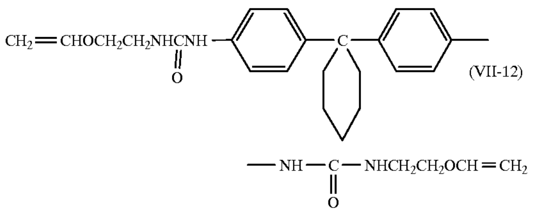

(VII-13)

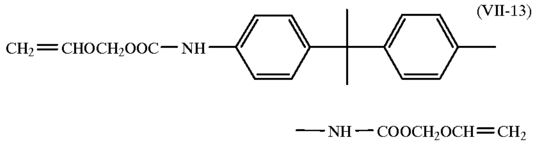

(VII-14)

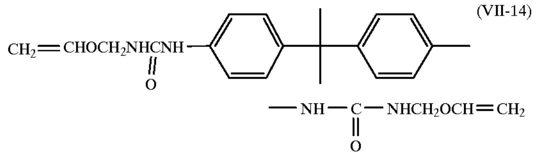

and (VII-15)

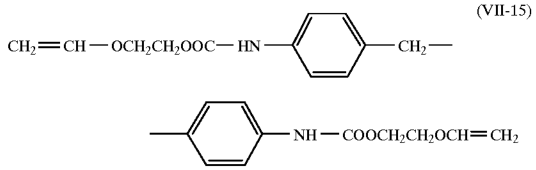

and (b) a linear polymer which includes a polymer unit derived from a vinyl monomer having an acidic group selected from the group consisting of a carboxyl group, a sulfonate group, a phosphate group and a sulfonamido group, wherein said thermally crosslinked product is insoluble in a solvent used in a developer, and (ii) a compound capable of generating an acid through irradiation with actinic light or radiant rays.

2. The positive-working light-sensitive composition of claim 1 wherein the amount of the vinyl ether compound added to the light-sensitive composition ranges from 5 to 50% by weight on the basis of the total solid content of the composition.

3. The positive-working light-sensitive composition of claim 1 wherein the linear polymer as the component (b) further has hydroxyl groups.

4. The positive-working light-sensitive composition of claim 1 wherein the linear polymer (b) has a weight average molecular weight ranging from 1,500 to 200,000.

5. The positive-working light-sensitive composition of claim 1 wherein the amount of the linear polymer (b) ranges from 20 to 90% by weight on the basis of the total solid content of the composition.

6. The positive-working light-sensitive composition of claim 1 wherein the compound capable of generating an acid through irradiation with actinic light rays or radiant rays is at least one member selected from the group consisting of:

(1) oxazole derivatives represented by the following general formula (VIII) or s-triazine derivatives represented by the following general formula (IX), substituted with trihalomethyl groups:

(VIII)

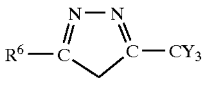

(IX)

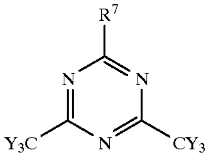

wherein $R^6$ represents a substituted or unsubstituted aryl or alkenyl group; $R^7$ represents a substituted or unsubstituted aryl, alkenyl or alkyl group or a group: —$CY_3$; and the substituent Y represents a chlorine or bromine atom;

(2) iodonium salts represented by the following general formula (X) or sulfonium salts represented by the following general formula (XI):

$$Ar^1Ar^2I^+Z^- \quad (X)$$

$$R^8R^9R^{10}S^+Z^- \quad (XI)$$

wherein $Ar^1$ and $Ar^2$ each independently represents a substituted or unsubstituted aryl group; $R^8$, $R^9$ and $R^{10}$ each independently represents a substituted or unsubstituted aryl group having 6 to 14 carbon atoms, a substituted or unsubstituted alkyl group having 1 to 8 carbon atoms or a substituted derivative thereof; $Z^-$ represents a counter anion selected from the group consisting of $BF_4^-$, $AsF_6^-$, $PF_6^-$, $SbF_6^-$, $SiF_6^-$, $ClO_4^-$, $CF_3SO^-$, $BPh_4^-$ (Ph:phenyl group), a condensed polynuclear aromatic sulfonate anion or an anion of a sulfonate group-containing dye; provided that any two of the substituents $R^8$, $R^9$ and $R^{10}$, and the substituents $Ar^1$ and $Ar^2$ may be linked through a single bond or a divalent substituent; and (3) disulfone derivatives represented by the following general formula (XII) or iminosulfonate derivatives represented by the following general formula (XIII):

(XII)

$$Ar^3—SO_2—SO_2—Ar^4$$

-continued (XIII)

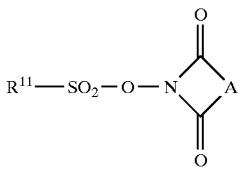

wherein $Ar^3$ and $Ar^4$ each independently represents a substituted or unsubstituted aryl group; $R^{11}$ represents a substituted or unsubstituted alkyl or aryl group; and A represents a substituted or unsubstituted alkylene, alkenylene or arylene group.

7. The positive-working light-sensitive composition of claim 1 wherein the compound capable of generating an acid through irradiation with actinic light rays or radiant rays is added to the light-sensitive composition in an amount ranging from 0.1 to 20% by weight on the basis of the total solid content of the composition.

* * * * *